United States Patent
Kaneko et al.

(10) Patent No.: US 9,548,310 B2
(45) Date of Patent: Jan. 17, 2017

(54) SEMICONDUCTOR DEVICE

(71) Applicant: KABUSHIKI KAISHA TOSHIBA, Tokyo (JP)

(72) Inventors: Hajime Kaneko, Yokkaichi Mie (JP); Satoshi Nagashima, Yokkaichi Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/611,929

(22) Filed: Feb. 2, 2015

(65) Prior Publication Data
US 2016/0005752 A1 Jan. 7, 2016

Related U.S. Application Data

(60) Provisional application No. 62/019,654, filed on Jul. 1, 2014.

(51) Int. Cl.
*H01L 29/06* (2006.01)
*H01L 27/115* (2006.01)

(52) U.S. Cl.
CPC ... *H01L 27/11519* (2013.01); *H01L 27/11524* (2013.01); *H01L 27/11529* (2013.01)

(58) Field of Classification Search
CPC ............ H01L 27/11519; H01L 27/11524; H01L 27/11529
See application file for complete search history.

(56) References Cited

U.S. PATENT DOCUMENTS

| | | | |
|---|---|---|---|
| 7,825,439 B2 | 11/2010 | Izumi et al. | |
| 8,298,928 B2 | 10/2012 | Yanagidaira et al. | |
| 2006/0278919 A1* | 12/2006 | Takahashi | H01L 27/115 257/316 |
| 2008/0219054 A1* | 9/2008 | Arai | H01L 27/115 365/185.13 |
| 2009/0155990 A1* | 6/2009 | Yanagidaira | H01L 21/31144 438/584 |
| 2010/0052031 A1* | 3/2010 | Lee | H01L 21/76897 257/315 |
| 2010/0246255 A1* | 9/2010 | Shiino | H01L 27/11521 365/185.2 |
| 2012/0032266 A1 | 2/2012 | Inoue et al. | |
| 2014/0291748 A1* | 10/2014 | Kanda | H01L 27/11517 257/316 |

\* cited by examiner

*Primary Examiner* — Victor A Mandala
(74) *Attorney, Agent, or Firm* — Patterson & Sheridan, LLP

(57) ABSTRACT

According to an embodiment, a semiconductor device includes a semiconductor substrate, a first region that is provided on the semiconductor substrate and has a line-and-space pattern extending in a first direction, and a second region that is provided adjacent to the first region on the semiconductor substrate and has a dummy pattern. The surface area per unit area of the second region is greater than the surface area per unit area of the first region.

6 Claims, 34 Drawing Sheets

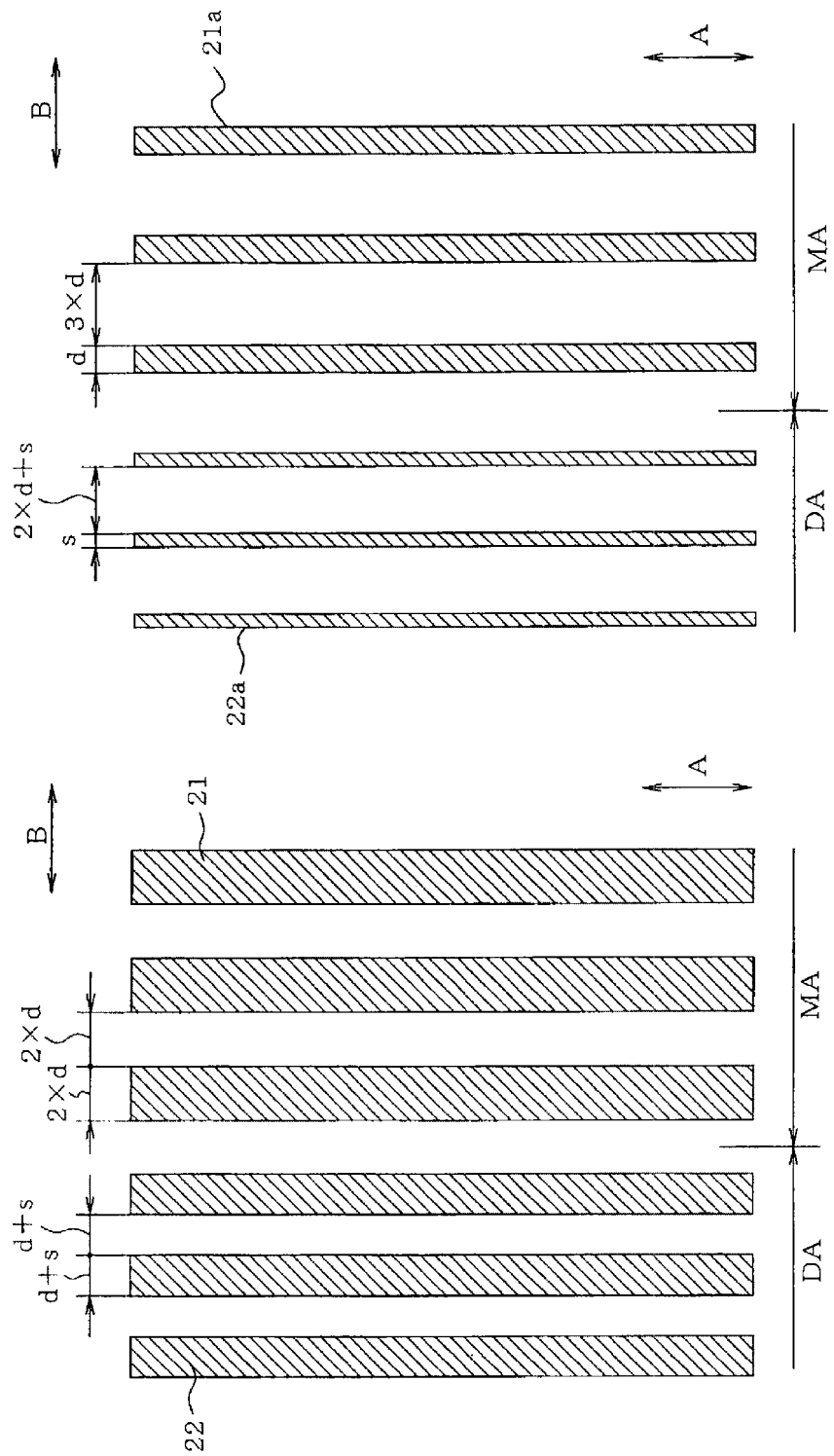

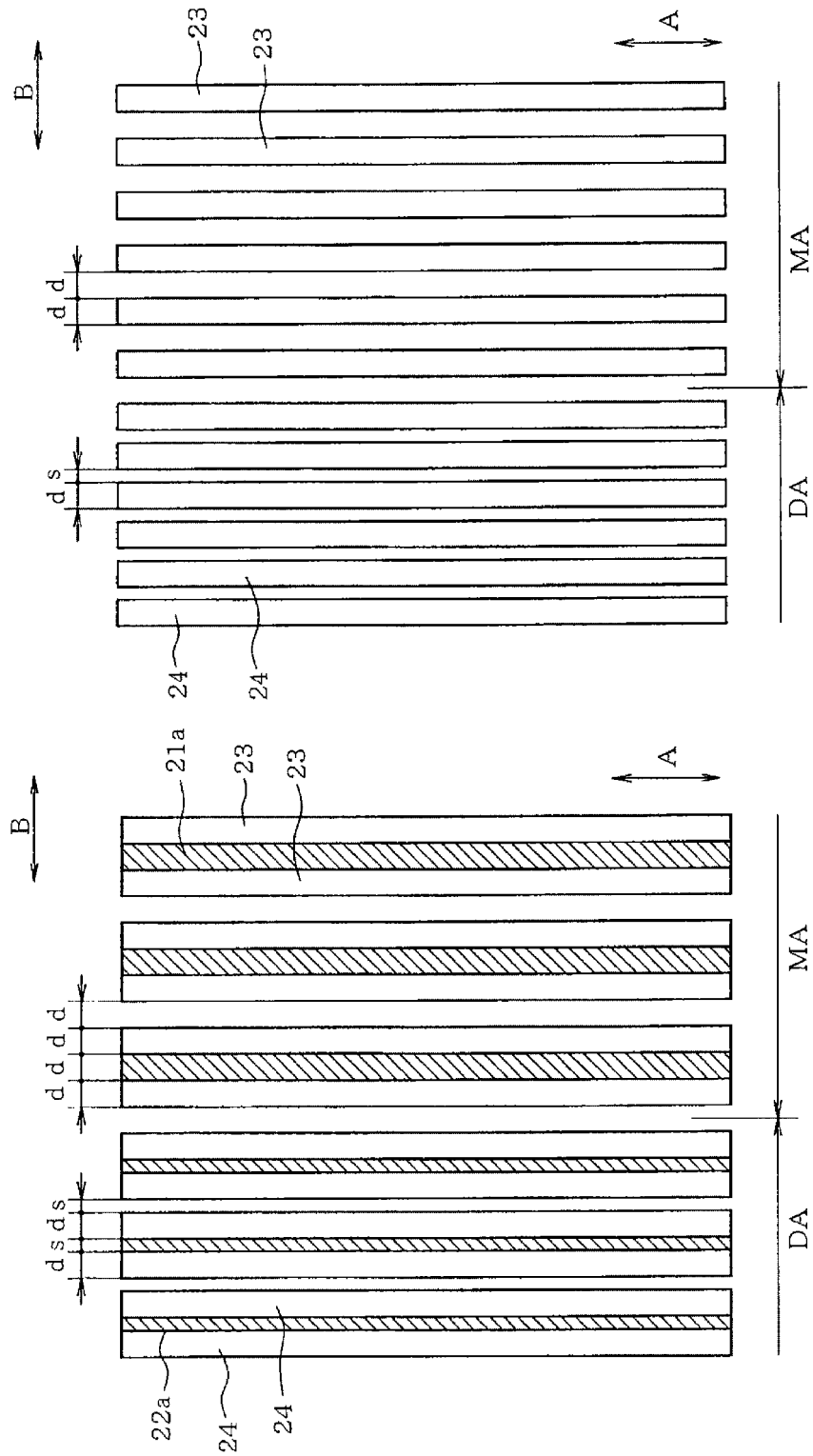

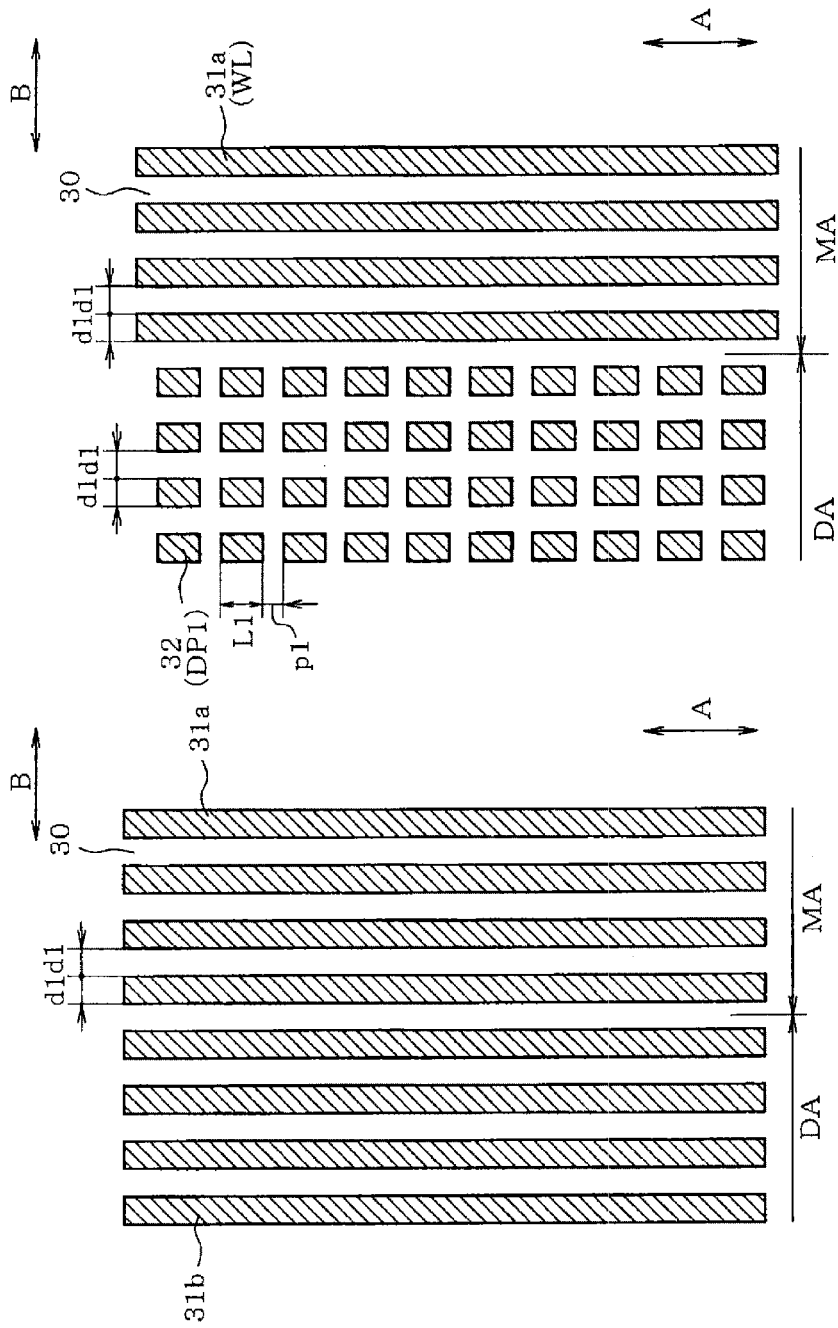

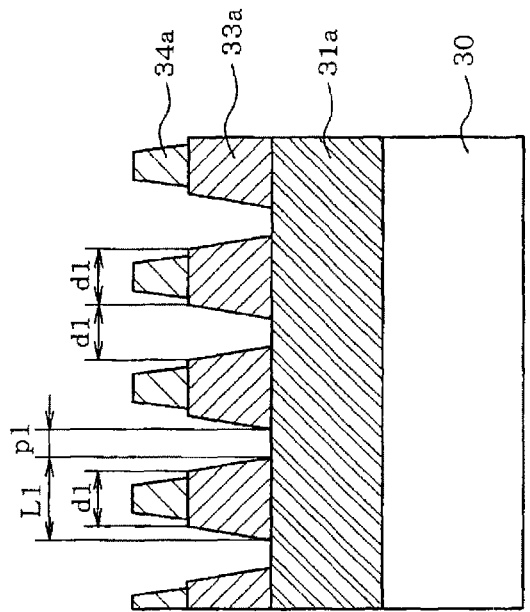
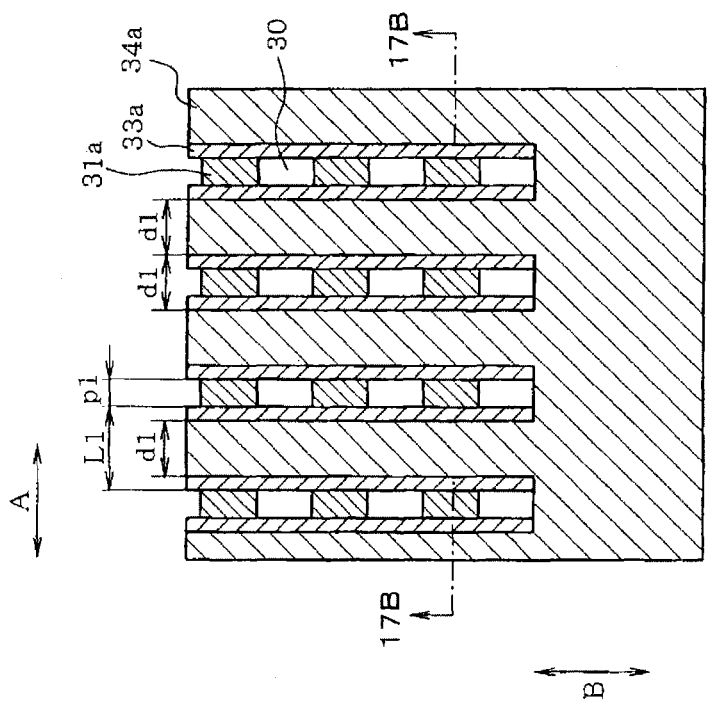
FIG. 17A
FIG. 17B

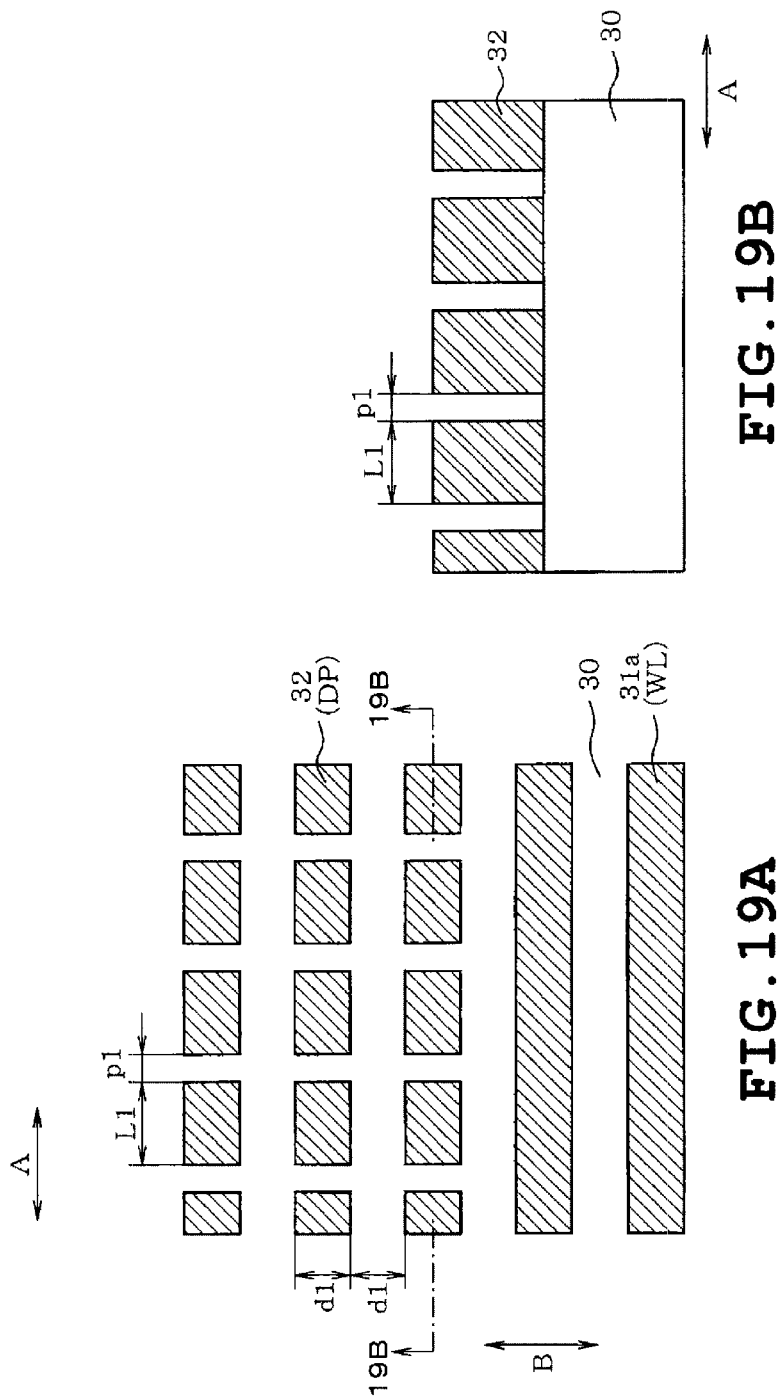

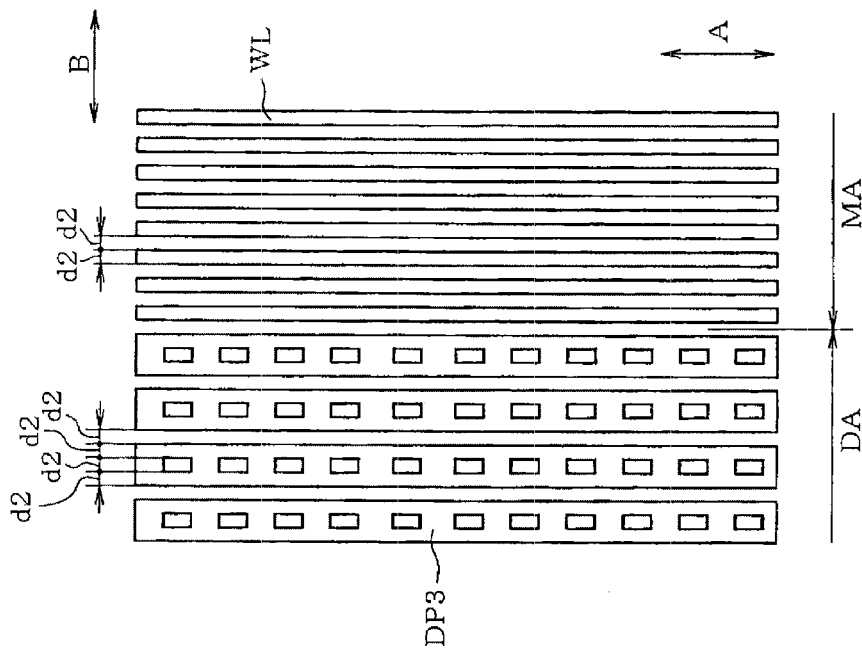
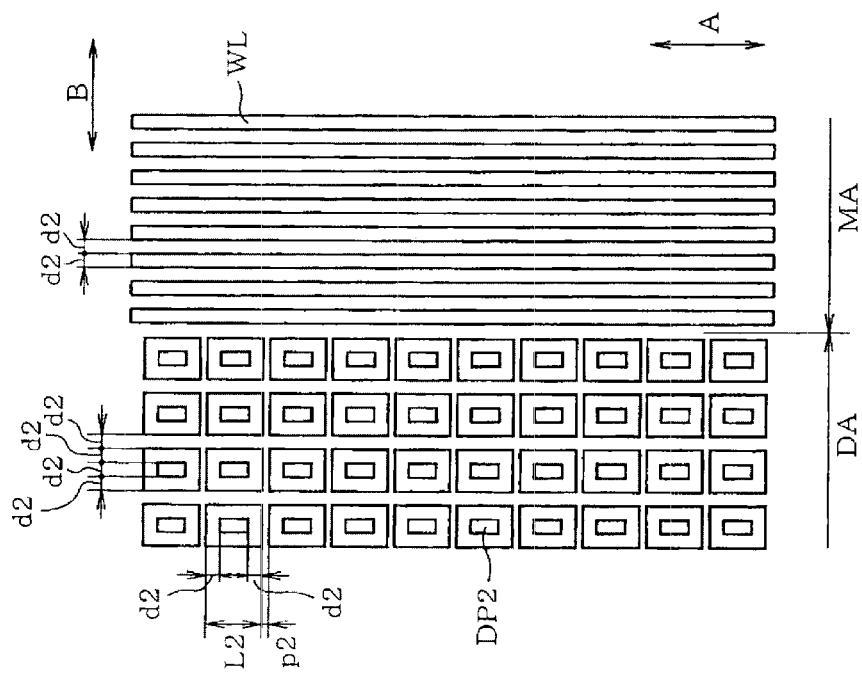

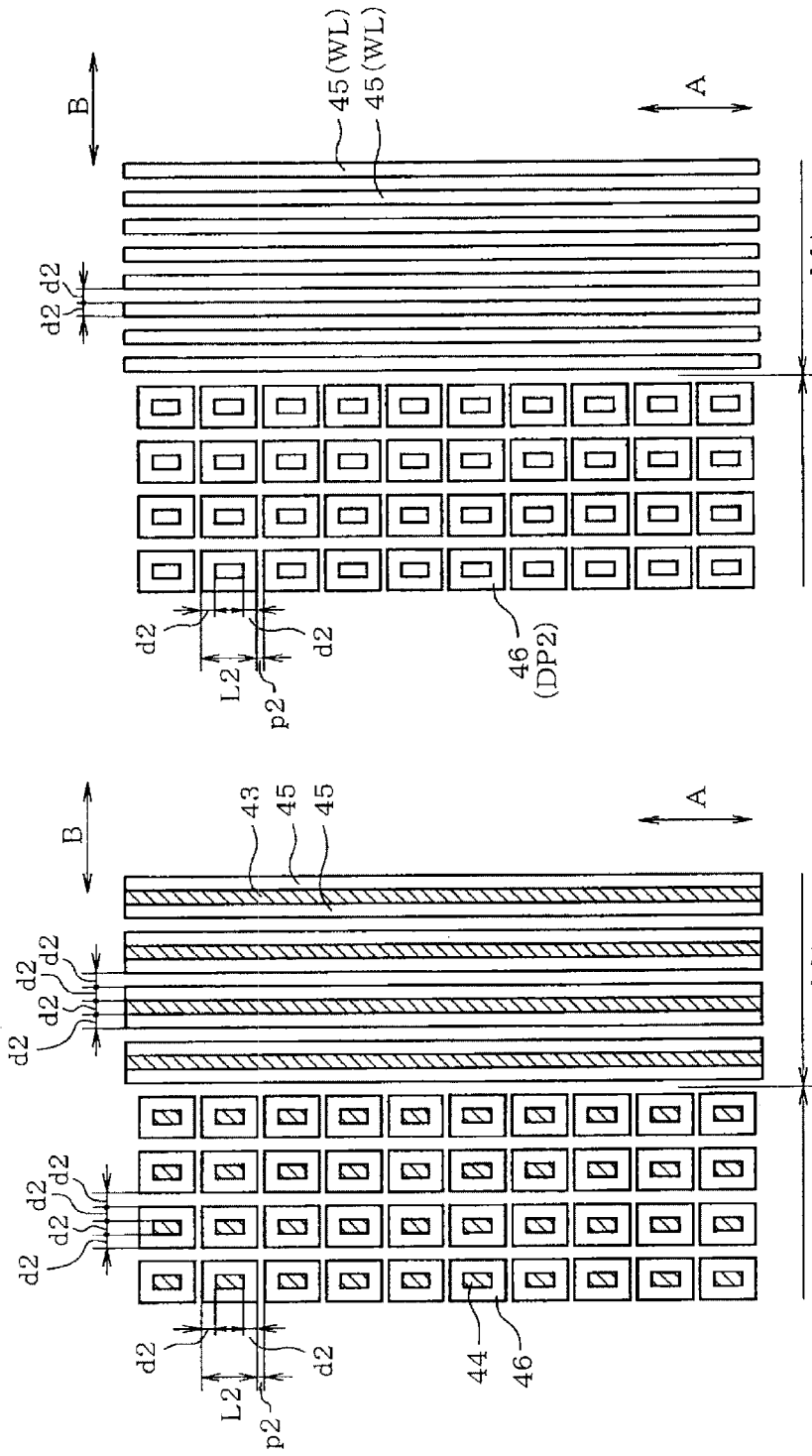

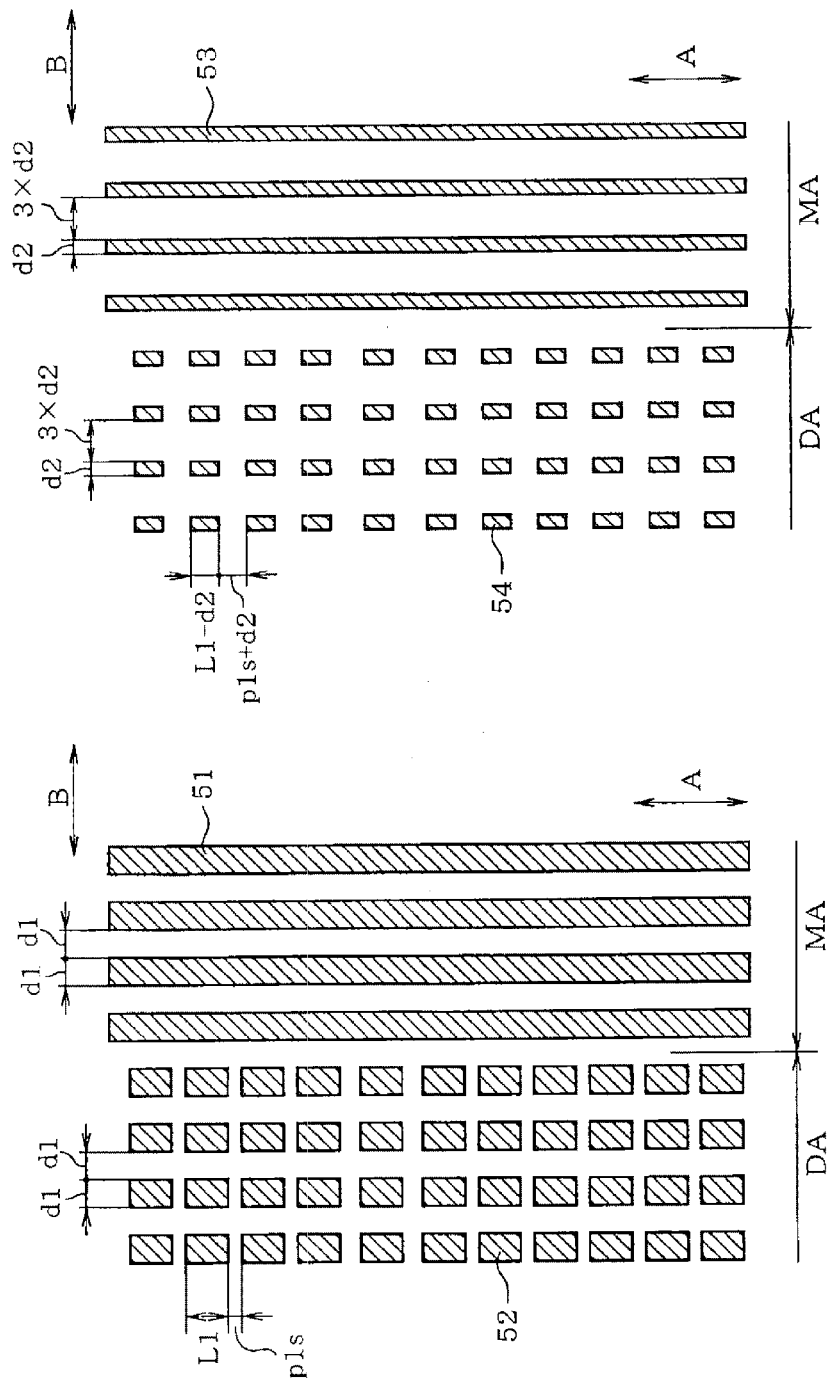

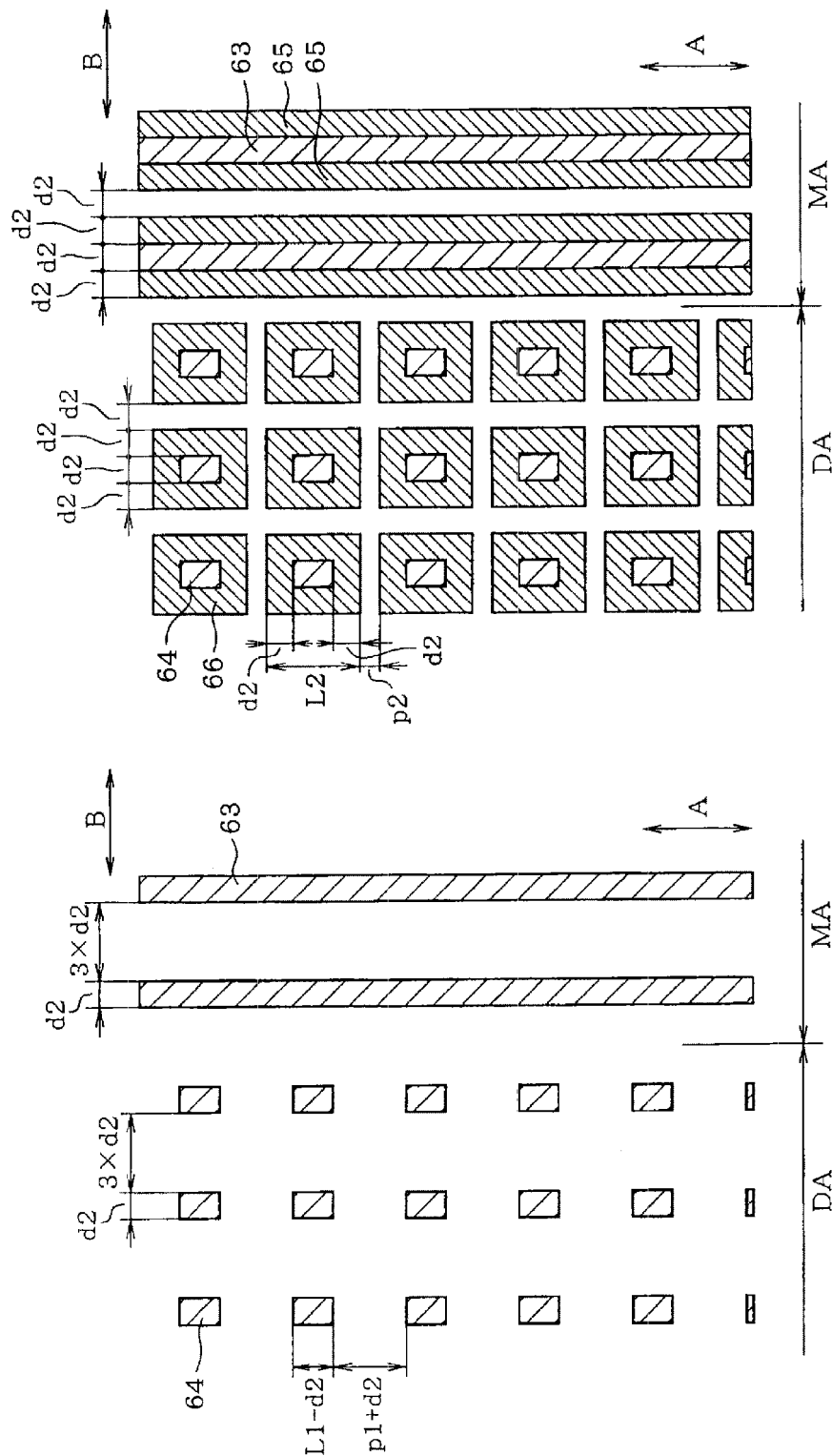

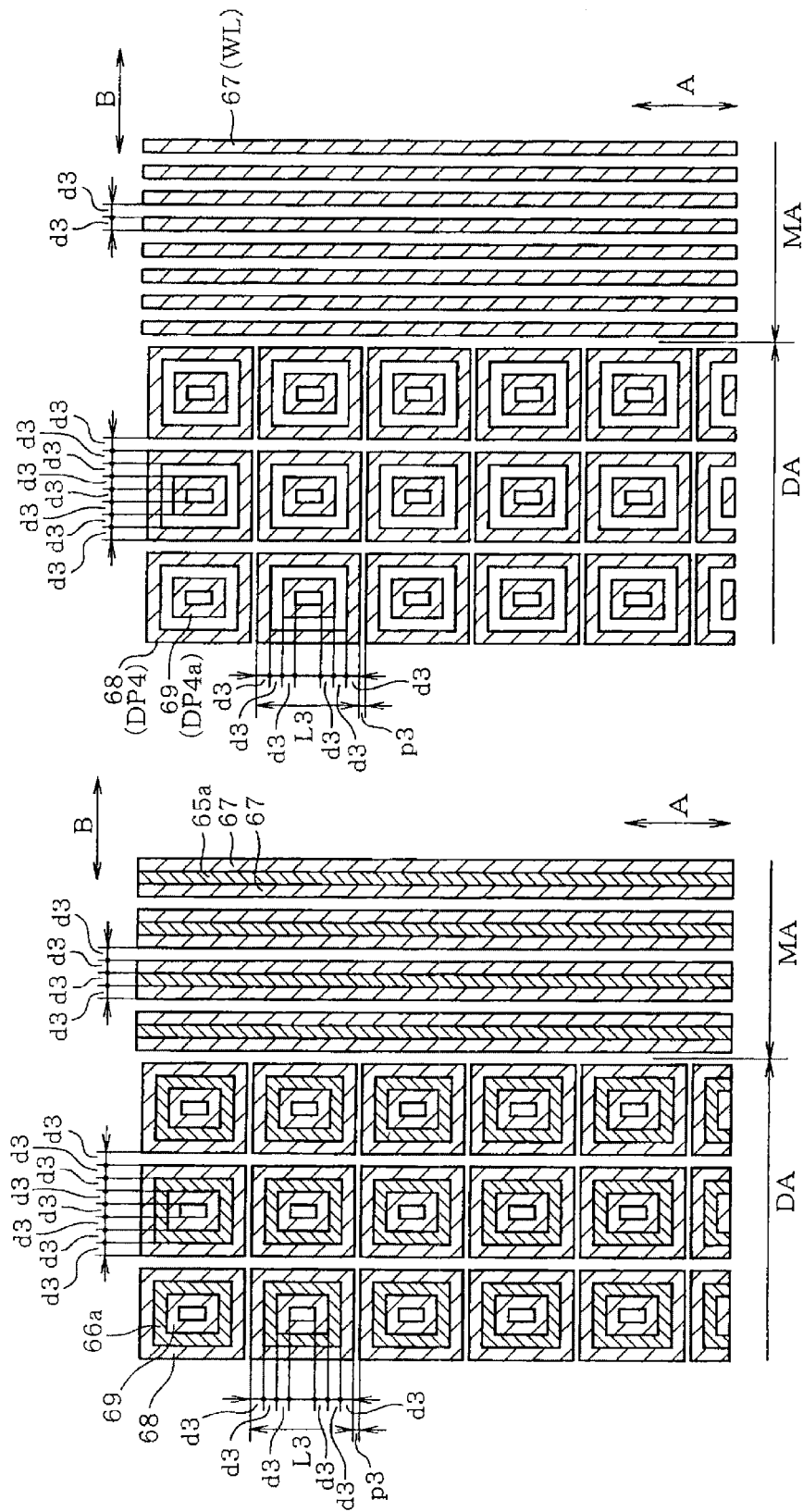

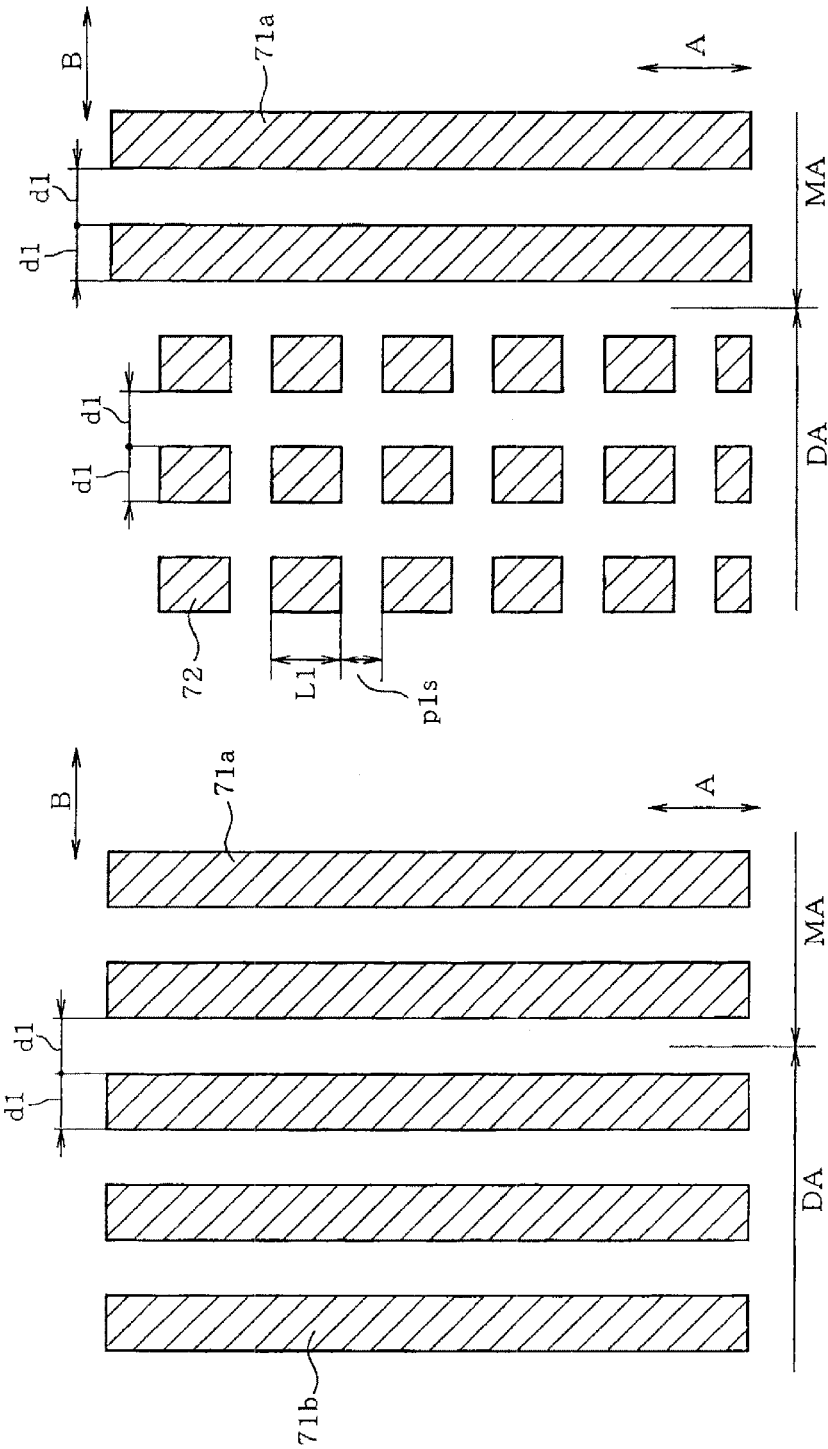

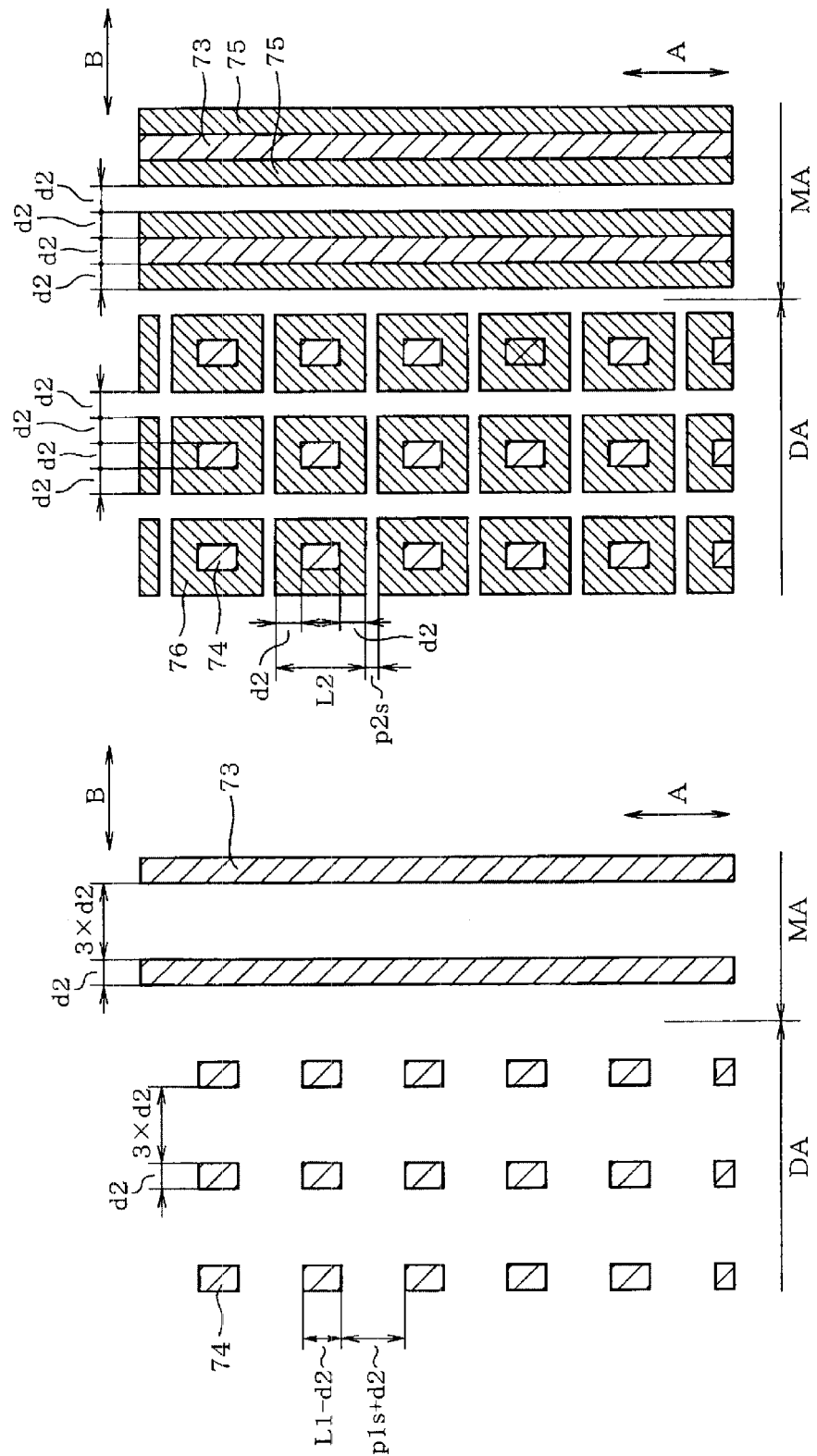

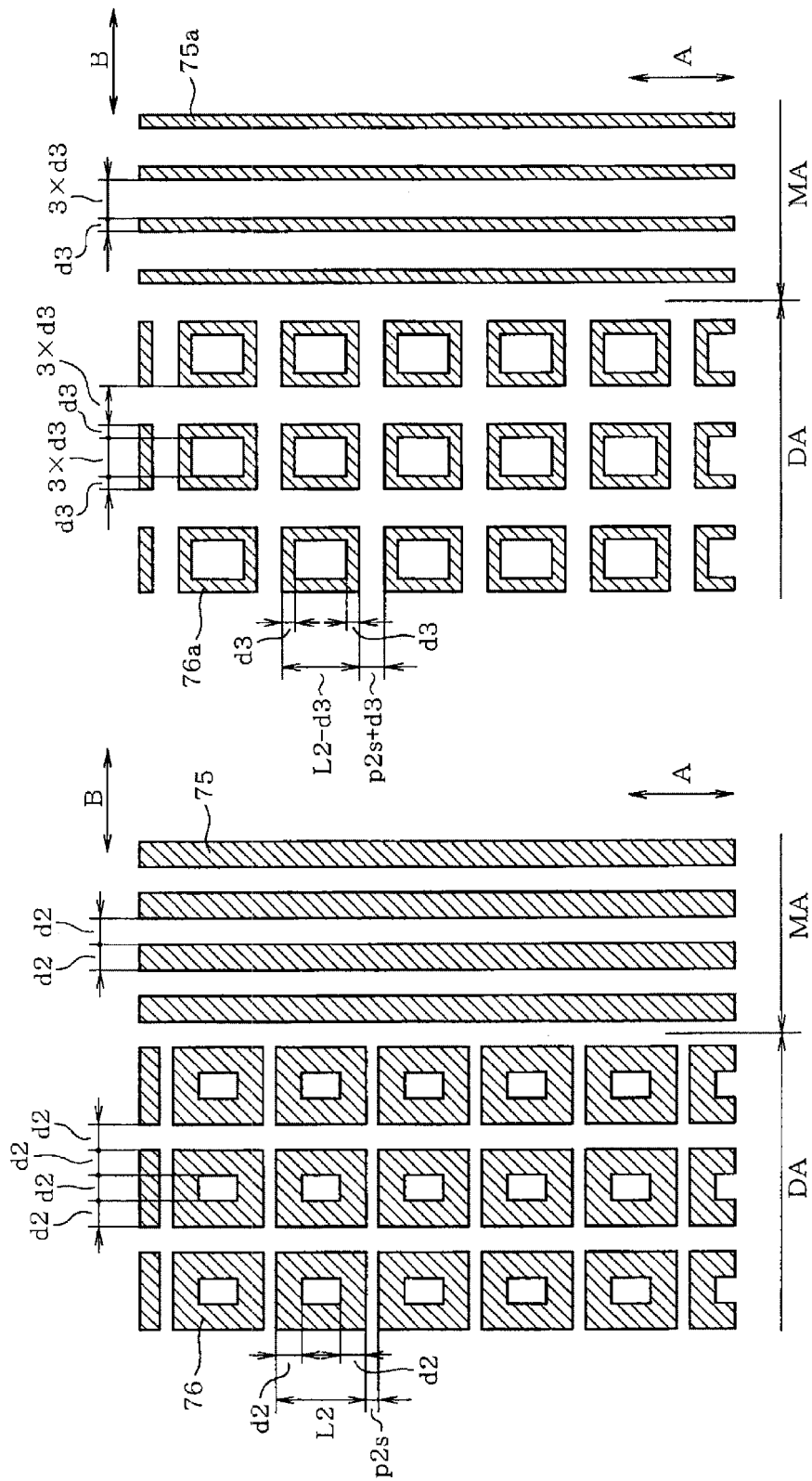

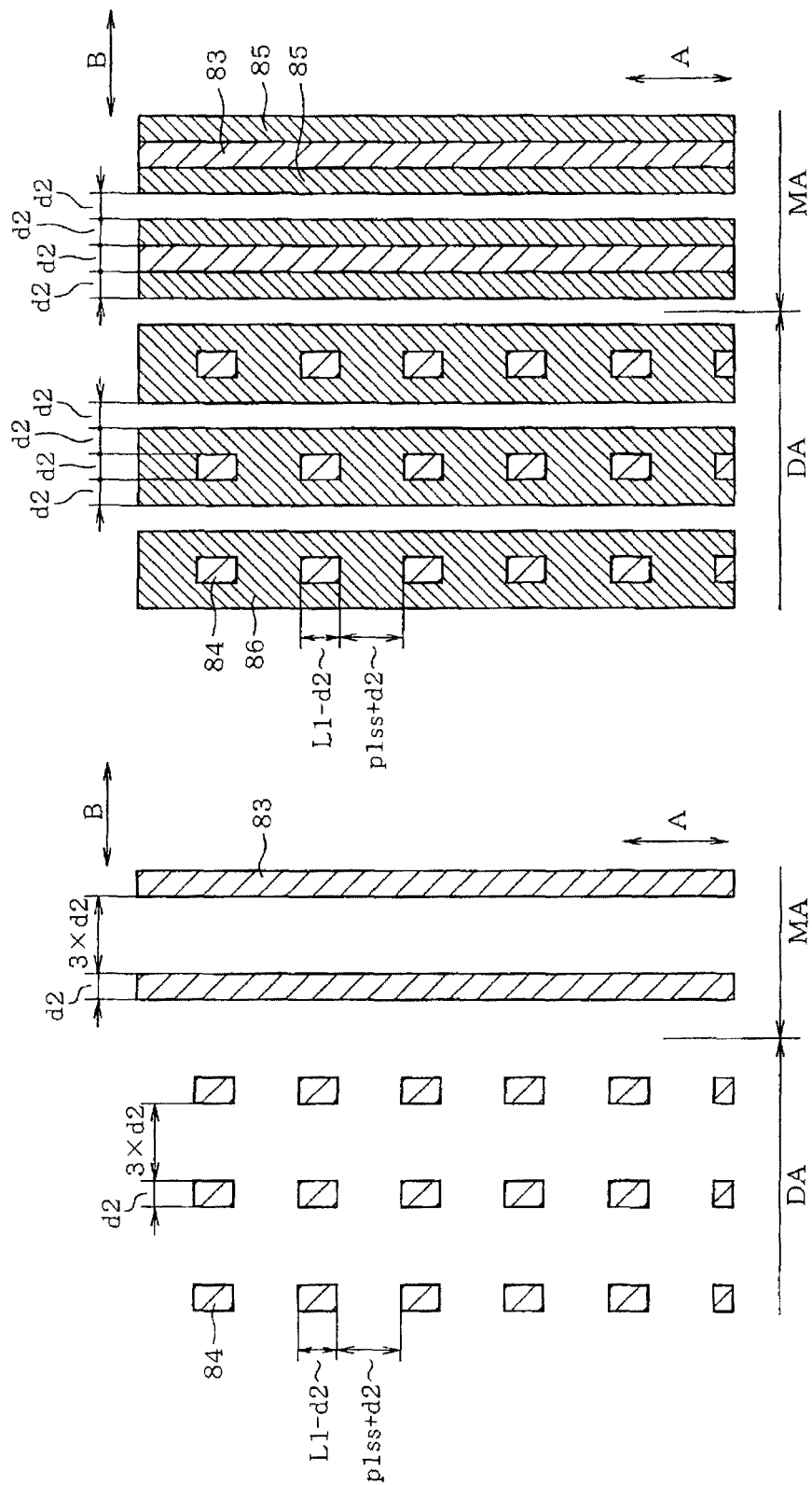

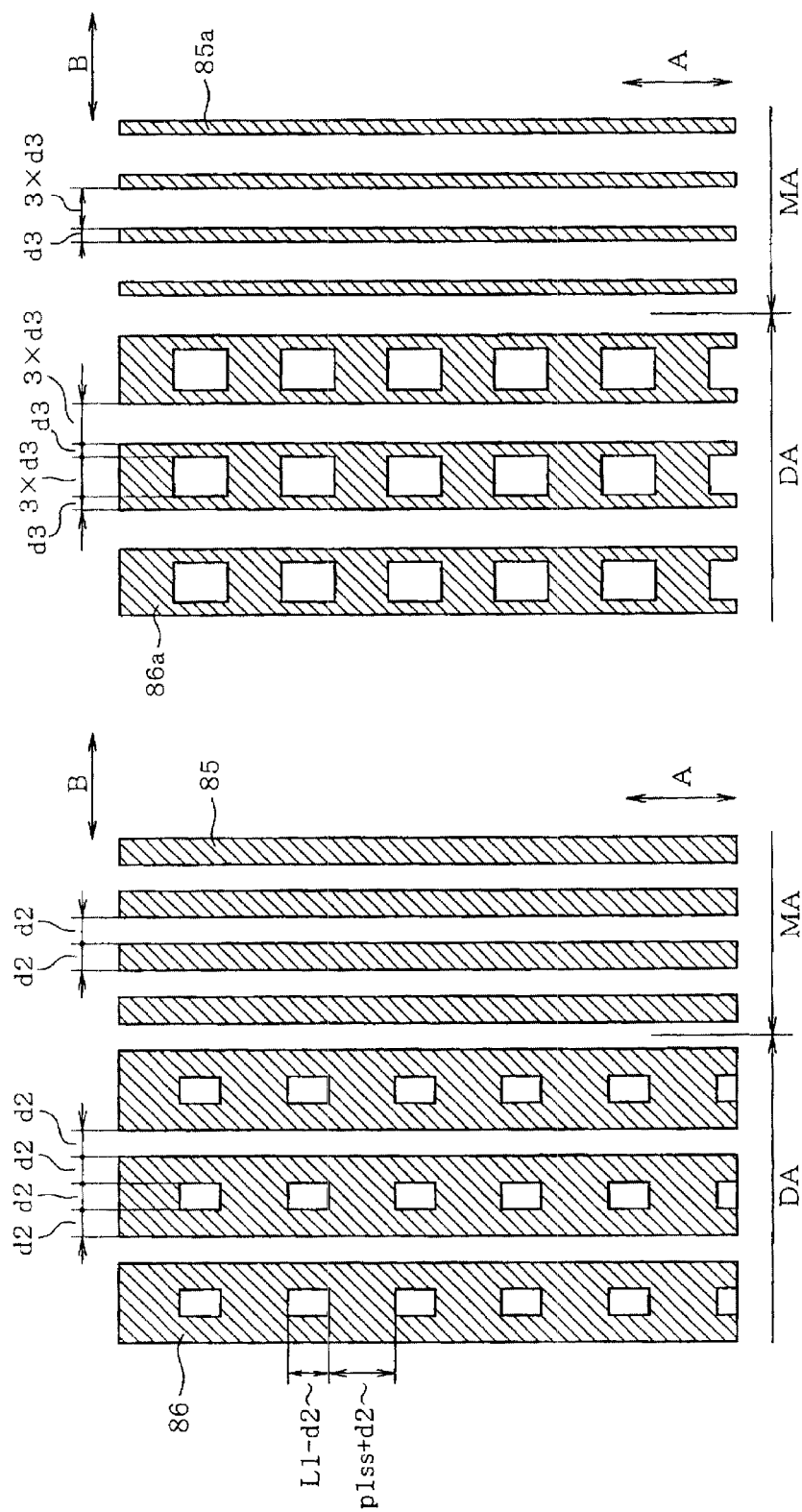

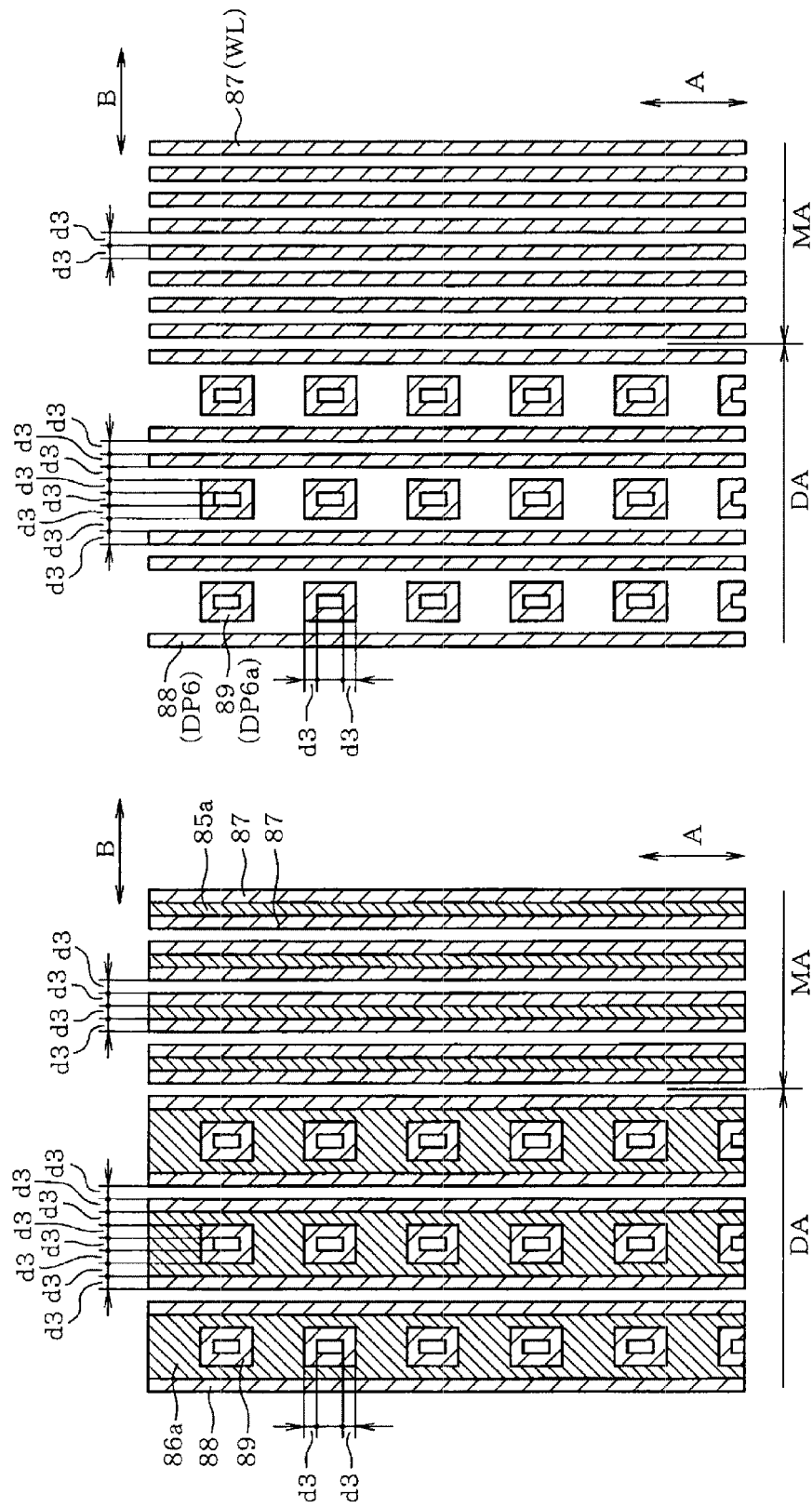

SEMICONDUCTOR DEVICE

INCORPORATION BY REFERENCE

This application is based upon and claims benefit of priority of U.S. Provisional Patent Application 62/019,654, filed on Jul. 1, 2014, the entire contents of which is incorporated herein by reference.

FIELD

Embodiments of the present disclosure relate to a semiconductor device.

BACKGROUND

In a semiconductor device including memory cells, a memory cell region provided with the memory cells is typically formed in the finest possible pattern (that is, having smallest possible feature sizes or spacing between features), and a peripheral circuit region provided in the periphery of the memory cell region is formed with feature sizes (or spacing between features) that is several to tens of times greater than that of the memory cells. Therefore, at the boundary between the memory cell region and the peripheral circuit region, the pattern density significantly changes. Therefore, during the patterning of the memory cell region, it becomes difficult to form the patterns at the center portion of the memory cell regions and at the region boundary at the same time with linearity.

BRIEF DESCRIPTION OF THE DRAWINGS

FIG. 7 is an example of a plan view illustrating a stage of a manufacturing process (part 1).

FIG. 8 is an example of a plan view illustrating a stage of the manufacturing process (part 2).

FIG. 9 is an example of a plan view illustrating a stage of the manufacturing process (part 3).

FIG. 10 is an example of a plan view illustrating a stage of the manufacturing process (part 4).

FIG. 13 is an example of a plan view illustrating a stage of a manufacturing process (part 1).

FIG. 14 is an example of a plan view illustrating a stage of the manufacturing process (part 2).

FIG. 17A is an example of a plan view illustrating a stage of the manufacturing process of forming pattern cuts, and FIG. 17B is an example of a longitudinal cross-sectional view of a part taken along line 17B-17B in FIG. 17A (part 3).

FIG. 19A is an example of a plan view illustrating a stage of the manufacturing process of forming pattern cuts, and FIG. 19B is an example of a longitudinal cross-sectional view of a part taken along line 19B-19B in FIG. 19A (part 5).

FIG. 20 is an example of a plan view illustrating patterns (part 1) of the dummy region adjacent to the memory cell region according to a third embodiment.

FIG. 21 is an example of a plan view illustrating patterns (part 2) of the dummy region adjacent to the memory cell region.

FIG. 24 is an example of a plan view illustrating a stage of the manufacturing process of the patterns of FIG. 20 (part 3).

FIG. 25 is an example of a plan view illustrating a stage of the manufacturing process of the patterns of FIG. 20 (part 4).

FIG. 26 is an example of a plan view illustrating a stage of a manufacturing process of the patterns of FIG. 21 (part 1).

FIG. 27 is an example of a plan view illustrating a stage of the manufacturing process of the patterns of FIG. 21 (part 2).

FIG. 35 is an example of a plan view illustrating a stage of the manufacturing process of the patterns of FIG. 30 (part 3).

FIG. 36 is an example of a plan view illustrating a stage of the manufacturing process of the patterns of FIG. 30 (part 4).

FIG. 39 is an example of a plan view illustrating a stage of the manufacturing process of the patterns of FIG. 30 (part 7).

FIG. 40 is an example of a plan view illustrating a stage of the manufacturing process of the patterns of FIG. 30 (part 8).

FIG. 41 is an example of a plan view illustrating a stage of a manufacturing process of the patterns of FIG. 31 (part 1).

FIG. 42 is an example of a plan view illustrating a stage of the manufacturing process of the patterns of FIG. 31 (part 2).

FIG. 43 is an example of a plan view illustrating a stage of the manufacturing process of the patterns of FIG. 31 (part 3).

FIG. 44 is an example of a plan view illustrating a stage of the manufacturing process of the patterns of FIG. 31 (part 4).

FIG. 45 is an example of a plan view illustrating a stage of the manufacturing process of the patterns of FIG. 31 (part 5).

FIG. 46 is an example of a plan view illustrating a stage of the manufacturing process of the patterns of FIG. 31 (part 6).

FIG. 51 is an example of a plan view illustrating a stage of the manufacturing process of the patterns of FIG. 32 (part 3).

FIG. 52 is an example of a plan view illustrating a stage of the manufacturing process of the patterns of FIG. 32 (part 4).

FIG. 53 is an example of a plan view illustrating a stage of the manufacturing process of the patterns of FIG. 32 (part 5).

FIG. 54 is an example of a plan view illustrating a stage of the manufacturing process of the patterns of FIG. 32 (part 6).

FIG. 55 is an example of a plan view illustrating a stage of the manufacturing process of the patterns of FIG. 32 (part 7).

FIG. 56 is an example of a plan view illustrating a stage of the manufacturing process of the patterns of FIG. 32 (part 8).

DETAILED DESCRIPTION

According to an embodiment, a semiconductor device includes a semiconductor substrate having a first region and a second region that is adjacent to the first region. In the first region a first line-and-space (L/S) pattern having lines extending along the semiconductor substrate in a first direction is disposed. In the second region, a dummy pattern having a surface area per unit area that is greater than a surface area of per unit area of the first line-and-space pattern is disposed.

(First Embodiment)

Hereinafter, a first embodiment explained with respect to a NAND type flash memory device with reference to FIGS. 1 to 10. Here, it should be noted the drawings are schematic and provided only for describing certain aspects of the present disclosure, thus the depicted relationships between thicknesses and planar dimensions, the ratios of the thicknesses of layers, and the like are not necessarily those in adopted in actual devices. In addition, the upward, downward, left, and right directions represent relative directions in a case where the circuit formation surface side in a semiconductor substrate, which will be described later, faces upward and do not necessarily coincide with directions with respect to the gravitational acceleration direction.

Figure 1:
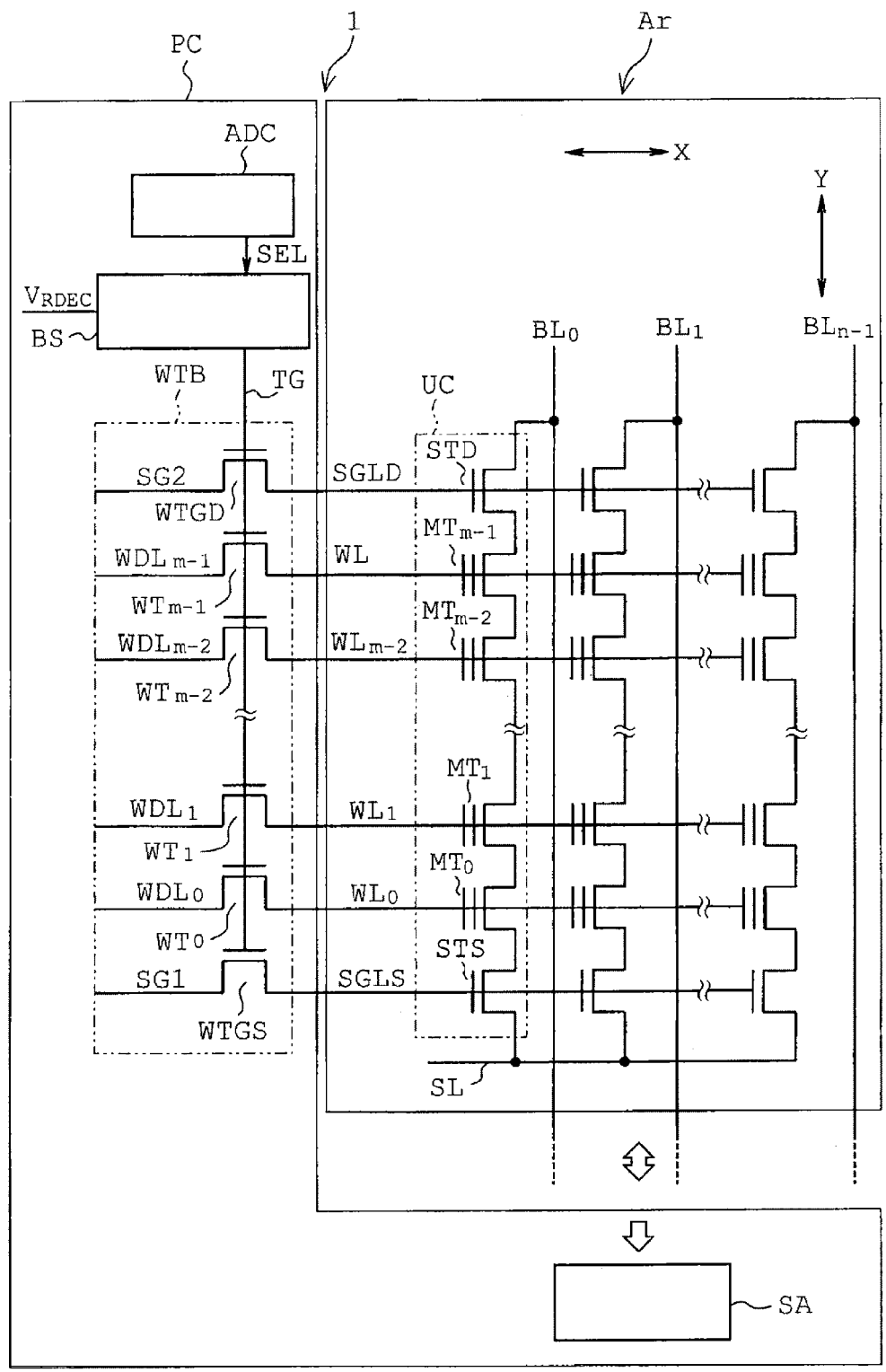
FIG. 1 is an example of an equivalent circuit schematically illustrating the electrical configuration of a memory cell region according to a first embodiment.

FIG. 1 schematically illustrates the electrical configuration of the NAND type flash memory device using a block diagram. As illustrated in FIG. 1, a NAND type flash memory device 1 includes a memory cell array Ar in which a number of memory cells are disposed in a matrix and a peripheral circuit PC which performs read/write/erase on each of the memory cells in the memory cell array Ar and also includes an input/output interface circuit (not separately illustrated) and the like.

A plurality of cell units (unit cells) UC are disposed in the memory cell array Ar. The cell unit UC includes a selection gate transistor STD connected to each of bit lines $BL_0$, ... $BL_{n-1}$, a selection gate transistor STS connected to a source line SL, and for example, 32 (thirty-two) memory cell transistors $MT_0$, ... $MT_{m-1}$ that are connected in series between the two selection gate transistors STD and STS.

A single memory block (block) includes cell units UC disposed in n columns parallel to each other in an X direction (row direction; the left and right direction in FIG. 1). The memory cell array Ar includes a plurality of memory blocks (blocks) disposed in a Y direction (column direction; the up and down direction in FIG. 1). Here, in order to simplify the description, a single block is illustrated in FIG. 1.

A peripheral circuit region is provided on the periphery of a memory cell region, and the peripheral circuit PC is disposed on the periphery of the memory cell array Ar. The peripheral circuit PC includes an address decoder ADC, a sense amplifier SA, a booster circuit BS having a charge pump circuit, a transfer transistor section WTB, and the like. The address decoder ADC is electrically connected to the transfer transistor section WTB via the booster circuit BS.

The address decoder ADC selects a single block when an address signal is applied thereto from the outside. The booster circuit BS is supplied with a driving voltage $V_{RDEC}$ from the outside of the address decoder ADC, and when a block selection signal SEL is applied, the booster circuit BS boosts the driving voltage $V_{VRDEC}$ and supplies a predetermined voltage to each of transfer gate transistors WTGD, WIGS, and $WT_0$ to $WT_{n-1}$ via a transfer gate line TG.

The transfer transistor section WTB includes the transfer gate transistor WTGD provided to correspond to the selection gate transistor STD, the transfer gate transistor WIGS provided to correspond to the selection gate transistor STS, the word line transfer gate transistors $WT_0$ to $WT_{m-1}$ provided to respectively correspond to the memory cell transistors $MT_0$ to $MT_{m-1}$. The transfer transistor section WTB is provided in each block.

One of the drain and the source of the transfer gate transistor WTGD is connected to a selection gate driver line SG2, the other of the drain and source of the transfer gate transistor WTGD is connected to a selection gate line SGLD. One of the drain and the source of the transfer gate transistor WIGS is connected to a selection gate driver line SG1, the other of the drain and source of the transfer gate transistor WIGS is connected to a selection gate line SGLS. In addition, one of the drain and the source of the transfer gate transistors $WT_0$ to $WT_{m-1}$ are respectively connected to word line driving signal lines $WDL_0$ to $WDL_{m-1}$, and the other of the drain and the source of the transfer gate transistors $WT_0$ to $WT_{m-1}$ are respectively connected to word lines $WL_0$ to $WL_{m-1}$ provided in the memory cell array Ar (the memory cell region M).

Gate electrodes SG (see FIG. 3A) of the selection gate transistors STD of the plurality of cell units UC disposed in the X direction are electrically connected to each other by the selection gate line SGLD. In the same manner, gate electrodes SG of the selection gate transistors STS of the plurality of cell units UC disposed in the X direction are electrically connected to each other by the selection gate line SGLS. The sources of the selection gate transistors STS are commonly connected to the source line SL.

Gate electrodes MG (see FIG. 3A) of the memory cell transistors $MT_0$ to $MT_{m-1}$ of the plurality of cell units UC disposed in the X direction are electrically connected by the word lines $WL_0$ to $WL_{m-1}$, respectively. For simplicity, the memory cell transistors $MT_0$ to $MT_{m-1}$ are called memory cell transistors MT in the description of FIG. 2 and subsequent figures.

The gate electrodes of the transfer gate transistors WTGD, WTGS, and $WT_0$ to $WT_{m-1}$ are commonly connected to the transfer gate line TG and are connected to a booster voltage supply terminal of the booster circuit BS. The sense amplifier SA is connected to the bit lines $BL_0, \ldots BL_{n-1}$ to be connected to a latch circuit that temporarily stores data during reading of the data.

Figure 2:
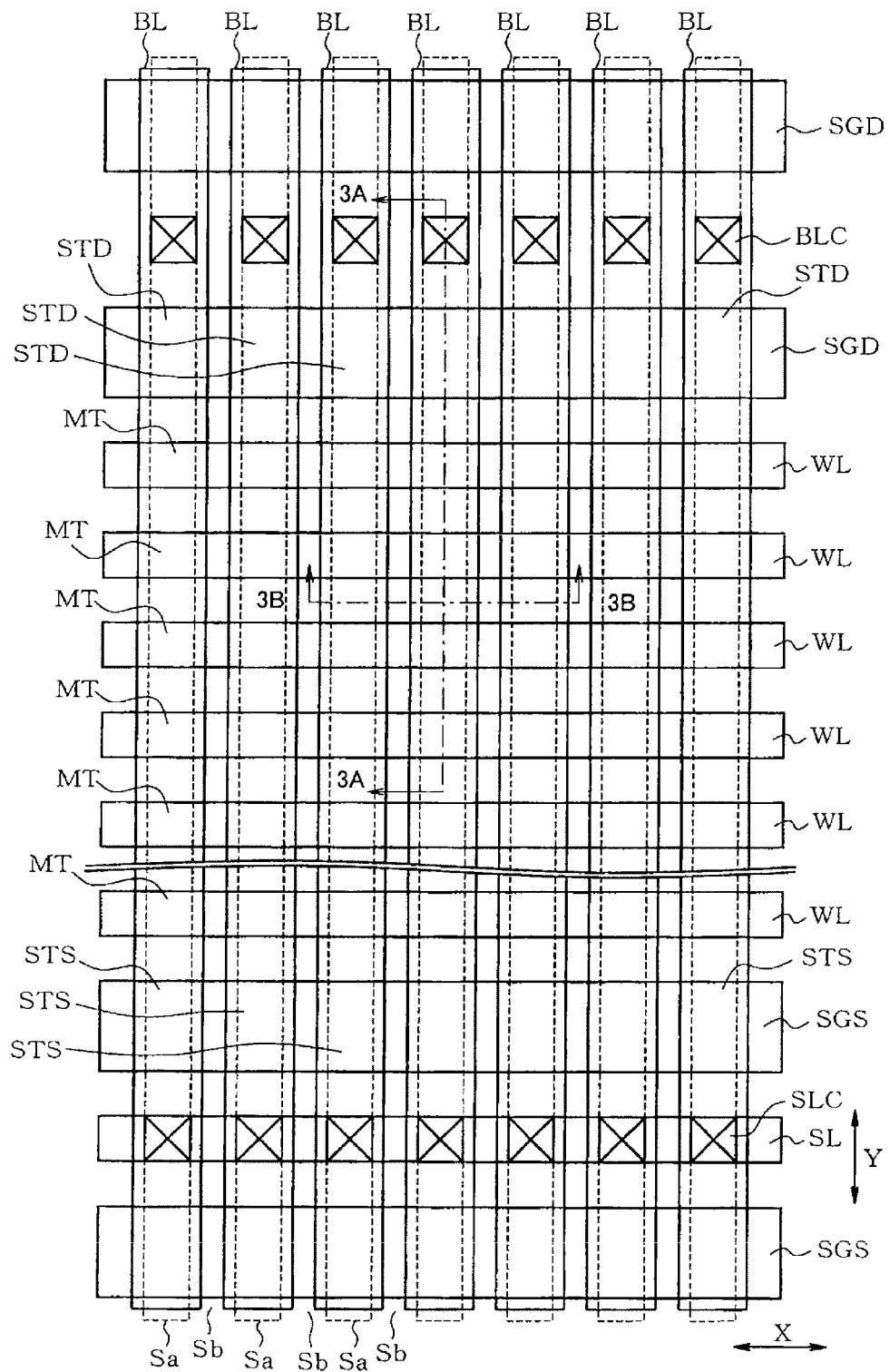
FIG. 2 is an example of a plan view illustrating a layout of the memory cell region.

FIG. 2 is an example of a plan view schematically illustrating a layout pattern of a portion of the memory cell region. In FIG. 2, the source line SL, a control line SGS, the word lines WL, and the selection gate lines SGD are separated from each other in the Y direction and are disposed to extend in the X direction to be parallel to each other. The bit lines BL are separated from each other at predetermined intervals in the X direction and are disposed to extend in the Y direction to be parallel to each other.

Element isolation regions Sb are formed to extend in the Y direction in the figure. The element isolation region Sb has an STI (shallow trench isolation) structure in which an insulating film is formed embedded into a trench. A plurality of element isolation regions Sb is formed at predetermined intervals in the X direction. A plurality of element regions Sa that are formed to extend along the Y direction on the surface layer portion of a semiconductor substrate are separated from each other in the X direction by the element isolation regions Sb. That is, the element isolation region Sb is provided between the element regions Sa, and the semiconductor substrate is separated into the plurality of element regions Sa by the element isolation regions Sb.

The word line WL is formed to extend along a direction perpendicular to the element region Sa (the X direction in FIG. 2). A plurality of word lines WL are formed at predetermined intervals in the Y direction. A memory cell transistor MT is disposed at each intersection between the word line WL and the element region Sa. The plurality of memory cell transistors MT, which are adjacent to one another in the Y direction, form a portion of a NAND string (memory cell string).

The selection gate transistors STS and STD are disposed at the intersections between the selection gate lines SGS and SGD and the element regions Sa. The selection gate transistors STS and STD are provided to be adjacent to both outer sides of the memory cell transistors MT at the end portions of the NAND string in the Y direction.

A plurality of selection gate transistors STS on the source line SL side are provided in the X direction, and the gate electrodes SG of the plurality of selection gate transistors STS are electrically connected to each other by the selection gate line SGS. The gate electrodes SG of the plurality of selection gate transistors STS are formed at parts where the selection gate line SGS and the element regions Sa intersect each other. Source line contacts SLC are provided at the intersection parts between the source line SL and the bit lines BL.

A plurality of selection gate transistors STD are provided in the X direction in the FIG. 2, and the gate electrodes SG of the plurality of selection gate transistors STD are electrically connected to each other by the selection gate lines SGD. The selection gate transistors STD are formed at parts where the selection gate lines SGD and the element regions Sa intersect each other. Bit line contacts BLC are respectively formed on the element regions Sa between the adjacent selection gate transistors STD.

Figure 3A:
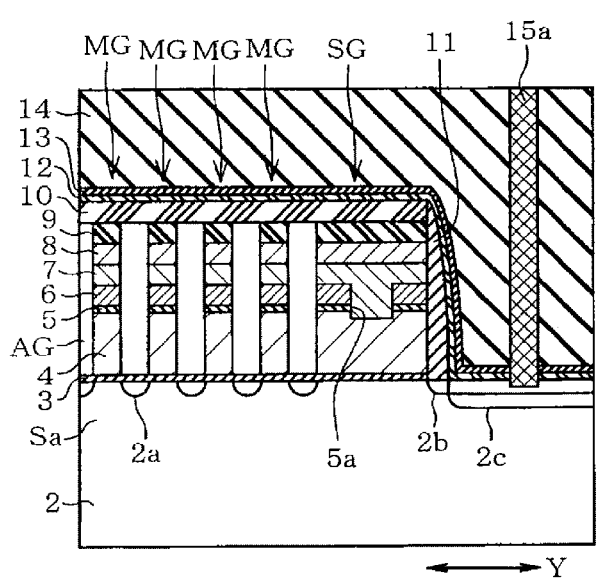
FIG. 3A is an example of a longitudinal cross-sectional view of a part taken along line 3A-3A in FIG. 2.
Figure 3B:
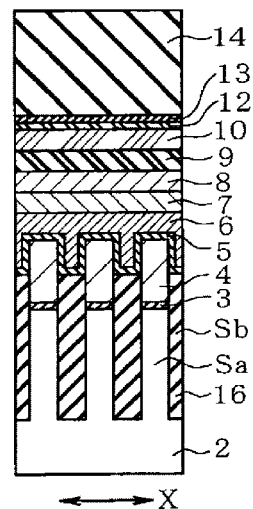
FIG. 3B is an example of a longitudinal cross-sectional view of a part taken along line 3B-3B.

FIGS. 3A and 3B schematically illustrate the cross-sectional structure of the element configuration of each memory cell region. FIG. 3A is a cross-sectional view of a part taken along line 3A-3A in FIG. 2. FIG. 3A illustrates the cross-section in the Y-direction through the memory cell transistors MT, the selection gate transistors ST (STD and STS), and a formation region of the bit line contact BLC between the selection gate transistors ST and ST. FIG. 3B is a cross-sectional view of a part taken along line 3B-3B in FIG. 2 and illustrates the longitudinal cross-section in the X-direction, which is a direction along which the word lines WL of the memory cell transistors MT are formed.

In FIGS. 3A and 3B, a gate insulating film 3 is formed on the upper surface of a silicon substrate 2, and on the upper surface thereof, the gate electrodes MG of the memory cell transistors MT and the gate electrodes SG of the selection gate transistors ST (STD and STS) are formed. The memory cell transistor MT has a configuration including the gate insulating film 3, the gate electrodes MG, and source/drain regions 2a formed on the silicon substrate 2 on both sides thereof. The memory cell transistors MT are formed to be adjacent to one another in the Y direction. A pair of selection gate transistors ST (STD and STS) are formed to be adjacent to the end portions of the memory cell transistors MT.

In gate electrode MG of the memory cell transistor MT, on the gate insulating film 3, a polycrystalline silicon film 4 as a floating gate electrode, an interelectrode insulating film 5, polycrystalline silicon films 6 and 7 as a control gate electrode, a metal film 8 made of tungsten or the like, and a silicon nitride film 9 are sequentially stacked. As the interelectrode insulating film 5, for example, an ONO (oxide-nitride-oxide) film, a NONON (nitride-oxide-nitride-oxide-nitride) film, an insulating film having a high dielectric constant, or the like is used.

The source/drain regions 2a are provided on the surface layer of the silicon substrate 2 positioned between adjacent gate electrodes MG and between the gate electrodes SG and MG. A LDD (lightly doped drain) region 2b corresponding to the drain region is provided on the surface layer of the silicon substrate 2 between the gate electrodes SG. The source/drain regions 2a and the LDD region 2b may be formed by implanting dopants into the surface layer of the silicon substrate 2. In addition, a drain region 2c is formed by implanting dopants at a high concentration into the surface layer of the silicon substrate 2 positioned between the gate electrodes SG, thereby forming an LDD structure.

The gate electrodes SG of the selection gate transistors ST (STD and STS) have substantially the same structure as that of the gate electrode MG of the memory cell transistor MT, and on the gate insulating film 3, the polycrystalline silicon film 4, the interelectrode insulating film 5, the polycrystalline silicon films 6 and 7, the metal film 8, and the silicon nitride film 9 are stacked. In the gate electrode SG, an opening 5a is provided at the center portion of the interelectrode insulating film 5 such that the polycrystalline silicon films 4 and 6 come into contact with each other and thus in a state of being electrically connected to each other.

In the gate electrodes MG and SG, an insulating film 10 is formed to lay across the upper surfaces of the gate electrodes MG and SG on the surface of the silicon nitride film 9 as the uppermost portion. The insulation film 10 is formed under conditions where it does not fill the voids between gate electrodes MG (or MG and SG) in the Y-direction. As the insulating film 10, for example, a silicon oxide film formed under the condition of a low embeddability (that is, poor trench filling conditions) may be used. By forming the insulating film 10 in such a manner, air gaps (voids) AG are provided between the gate electrodes MG and MG and the gate electrodes MG and SG and an insulating state between adjacent gate electrodes (MG and MG or MG and SG) is achieved without embedding an insulating film.

In a part where the gate electrodes SG oppose each other, the air gap AG is not provided, and a spacer 11 (spacer film) is provided along the side surface (sidewall) of the gate electrode SG. The spacer 11 may use, for example, a silicon oxide film and is formed to reach the upper surface of the silicon substrate 2 from the upper surface part of the gate electrode SG.

On the insulating film 10, a silicon oxide film 12 and a silicon nitride film 13 are sequentially formed to cover the upper portion of the insulating film 10, the surface of the spacer 11 between the gate electrodes SG, and the surface of the silicon substrate 2 exposed to the bottom surface portion. On the silicon nitride film 13, an interlayer insulating film 14 is formed to bury/fill a concave portion between the gate electrodes SG and to cover the upper surfaces of the gate electrodes MG and SG. A contact plug 15a is formed to penetrate through the interlayer insulating film 14 from the upper portion to the lower portion thereof, furthermore the contact plug 15a penetrates through the silicon nitride film 13 and the silicon oxide film 12, and reaches the silicon substrate 2 in the concave portion region between the gate electrodes SG.

In FIG. 3B illustrating the cross-section of the memory cell transistor MT in the X direction, the element formation regions Sa are separated in the X direction in the figure (X direction of FIG. 2A) by the element isolation regions Sb. On the element formation region Sa, the gate insulating film 3 is provided, and the polycrystalline silicon film 4 is provided thereon.

In the element isolation region Sb, an element separation insulating film 16 is formed to fill the concave portion of the silicon substrate 2, and the upper surface thereof reaches a substantially intermediate height of the polycrystalline silicon film 4. The interelectrode insulating film 5 is provided along the surfaces of the polycrystalline silicon film 4 and the element separation insulating film 16 to cover them. On the element separation insulating film 16, the polycrystalline silicon films 6 and 7 and the metal film 8 are provided. The silicon nitride film 9 is formed on the upper portion of the metal film 8.

In the above-described configuration, parts including the polycrystalline silicon films 6 and 7 and the metal film 8 function as the control gate electrode and are also provided as the word lines WL connected in the X direction. In addition, in the same manner, although not illustrated, the selection gate transistors ST (STD and STS) also employ the same stacked structure, and parts including the polycrystalline silicon films 6 and 7 and the metal film. 8 are provided as the selection gate lines SGS and SGD.

In the above-described configuration, in the memory cell transistors MT, a floating gate layer, a control gate layer, and a bit line layer are smallest in size in the semiconductor device and are formed in lines and spaces patterns corresponding to the final device sizes. Contrary to this, transistors in the peripheral region are logic circuits and the dimensions thereof are several to tens of times that of the memory cell transistor MT. Therefore, compared in the same area, the surface area of the memory cell region in which convex and concave portions are densely packed is greater than the surface area of the peripheral circuit region due to the pattern density variation between the regions.

In addition, a density difference of the pattern rapidly changes in the peripheral portion of the memory cell region, and thus it becomes difficult to process the peripheral portion into the same shape as that of the pattern on the internal side of the region. Therefore, in the periphery of the array end of the memory cell region, a dummy pattern having the same pattern as the cell array is formed to stabilize the shape effects at the region boundaries. However, by only disposing the same dummy pattern as the cell array, a shape difference still significantly remains. Accordingly, in a circumstance in which a higher degree of fineness is achieved, the difference in shape affects the elements.

Figure 4:
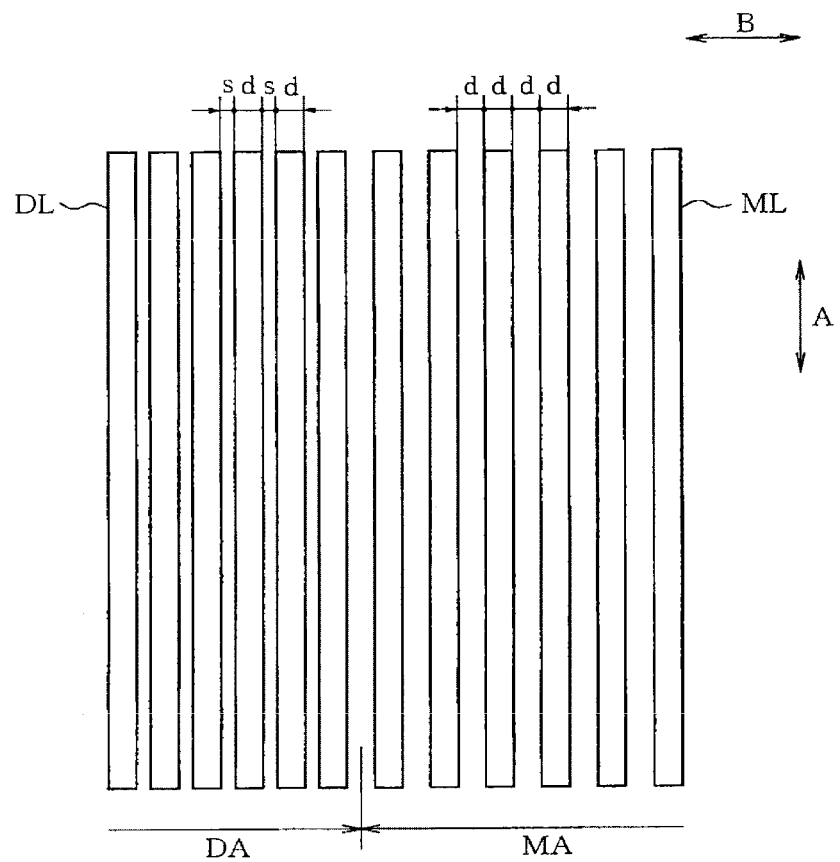
FIG. 4 is an example of a plan view illustrating patterns of a dummy region adjacent to the memory cell region.

In this embodiment, in order to solve this problem, as illustrated in FIG. 4, a dummy region DA provided with the dummy patterns is disposed as a second region in a region adjacent to the memory cell region MA as a first region. In the memory cell region MA, as a line-and-space pattern that extends in a first direction (hereinafter, referred to as an A direction), the word lines WL are disposed to be lined up to have a pattern width d at an interval d in a second direction (hereinafter, referred to as a B direction). Contrary to this, in the dummy region DA adjacent to the memory cell region MA, dummy lines DL as the dummy patterns are disposed to be lined up to have a pattern width d at an interval s (<d) that is smaller than d. The number of dummy lines DL provided in the dummy region DA is set to be a number such that strain does not occur during pattern formation in the memory cell region MA. In addition, a single or a plurality of word lines WL at the end portion of the memory cell region MA may be used for element formation or may be disposed as dummy lines that are not directly used as elements.

By using a semiconductor substrate W in which the dummy lines DL are disposed in the dummy region DA as described above, the following effects may be obtained during an etching process. That is, FIG. 5 illustrates an internal state of a reactive ion etching device in a case where etching according to an RIE (reactive ion etching) method is performed, along with the semiconductor substrate W.

Figure 5:
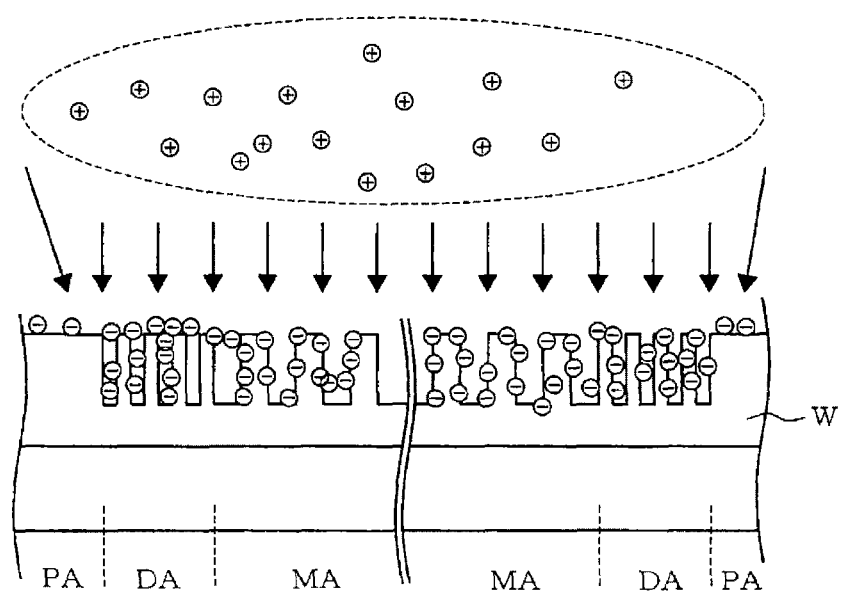
FIG. 5 is an example of a schematic cross-sectional view illustrating the cross-section of a wafer and a charge distribution state in a case where etching is performed on the patterns on the wafer.

As illustrated in FIG. 5, during ion etching such as the RIE method, positive ions are present in a chamber, and electrons are distributed on the surface by a negative potential applied to the semiconductor substrate W side. In this case, when it is postulated that the electrons are uniformly distributed on the surface, a larger number of electrons are distributed on a side having a larger surface area. Therefore, generally, since the surface area of the patterns in the memory cell region MA is large, electrons (negative charges) are likely to be accumulated on the surface. In contrast, in the peripheral region, since the surface area is smaller, electrons are less likely to be accumulated. In addition, by providing the dummy region DA in which the patterns have a large surface area, a part where electrons are most likely to be accumulated may be disposed in this region.

In this case, according to a related art, during the etching treatment according to the RIE method, positive ions are attracted to the electrons when etching a typical substrate W and these positive ions are incident onto the periphery of the array in a direction inclined with respect to the array end—that is, ions are incident on the substrate W at an oblique angle at the periphery of the array rather than perpendicular. Due to this influence, the end portion of the memory cell region MA is obliquely processed and has a different shape from that of the center of the array. As a potential countermeasure, this problem may be solved by simply enlarging the dummy pattern region. However, in this case, the enlargement leads to an increase in the semiconductor die area.

Figure 6:
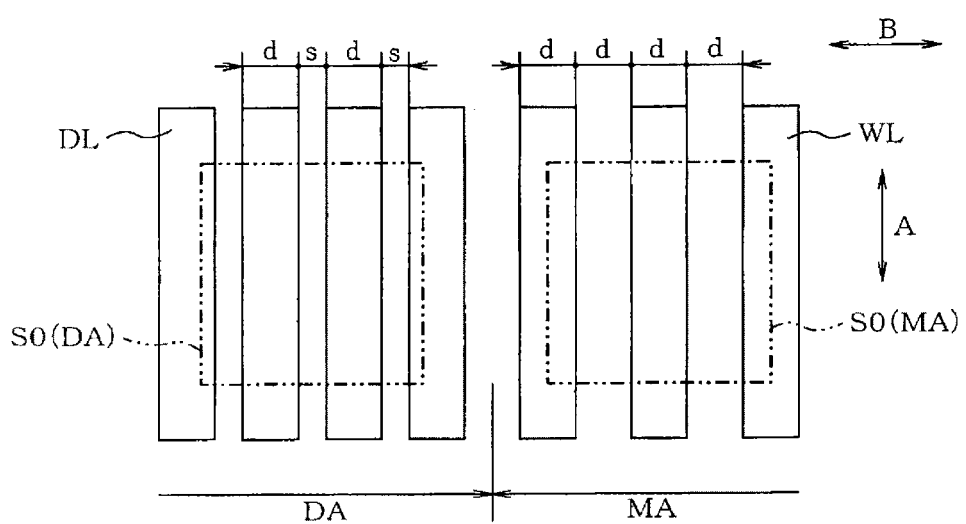
FIG. 6 is an example of an explanatory view for comparison between surface areas in the case where etching is performed on the patterns.

In this embodiment, the dummy lines DL are densely disposed in the B direction by narrowing the intervals therebetween such that the surface area of features in the dummy pattern region becomes greater than that of the memory cell region MA. As illustrated in FIG. 6, for example, when an arbitrary unit area S0 is postulated, in the memory cell region MA, four sidewall surfaces of the word lines WL are included in the surface area S0 (MA). On the other hand, in the dummy region DA, six sidewall surfaces of the dummy lines DL are included in the surface area S0 (DA). Since the heights of the patterns of the word lines WL and the dummy lines DA are the same, surface areas SS of the patterns included in the unit area S0 of the two regions are different from each other by the difference in the number of sidewall surfaces therein. When it is assumed that the area of a single sidewall surface is Ssw, the surface area SS (MA) of the patterns in the memory cell region MA is obtained by the following expression (1), and the surface area SS (DA) of the patterns in the dummy region DA is obtained by the following expression (2). Therefore, when a difference $\Delta SS$ between the two surface areas is obtained, it may be seen that the surface area SS (DA) in the dummy region DA is larger.

$$SS(MA)=S0(MA)+4Ssw \quad (1)$$

$$SS(DA)=S0(DA)+6Ssw \quad (2)$$

$$\Delta SS=SS(DA)-SS(MA)=2Ssw \quad (3)$$

That is, in a comparison between the memory cell region MA and the dummy region DA, the surface area SS (DA) of the patterns in the dummy region DA is greater than the surface area SS (MA) of the patterns in the memory cell region MA by the area of the two sidewall surfaces. Accordingly, the peripheral part of the memory cell region MA described above is in a state in which the surface area of the patterns thereof is smaller than that of the dummy region DA. As a result, in a case where etching is performed by the RIE method using the depicted patterns, charges are most concentrated on the dummy line DL parts. Therefore, positive ions that are obliquely incident from the peripheral circuit side are attracted to the dummy line DL parts, and the oblique incidence of positive ions to the word lines WL at the end portion of the memory cell region MA is reduced. Accordingly, problems that occur in the related art as described above may be avoided. In addition, in this case, since the problems are avoided by increasing the surface area, unlike the countermeasure of simply enlarging the dummy pattern, an increase in the disposition area (device die area) on the substrate may be avoided.

Hereinafter, a manufacturing process of the dummy patterns illustrated in FIG. 4 will be described with reference to FIGS. 7 to 10. In addition, in the following description, as an example of a case in which a pattern having a part where a dense pattern portion and a sparse pattern portion are adjacent to each other, such as a line-and-space pattern, is formed at the same time, a processed part of the word line WL is described. As the part, there is a patterning part in a case where the element isolation regions are formed on the surface portion of the other semiconductor substrate W, or a part where the bit lines are patterned.

First, before describing the formation of the pattern of the dummy lines DL, a sidewall transfer technique in which a pattern is processed with a smaller patterning width than the limit of the patterning minimum width which may be achieved in a conventional, single-pass photolithography technique is briefly described.

In the sidewall transfer technique, basically, a first film and a second film made of two different types of materials capable of achieving a large etching selectivity are used as processing films for a film to be processed. The first film and the second film are films for forming a hard mask for etching the film to be processed. The film to be processed, the first film, and the second film use, for example, three different types of films capable of achieving an etching selectivity such as a silicon film such as an amorphous silicon film, a silicon oxide film, a silicon nitride film, and the like.

In a process of forming the hard mask, the first film becomes a core material that is formed on the film to be processed. Subsequently, the first film is processed into a line-and-space pattern having a first width by a conventional lithography technique. This film may be patterned to have, for example, the minimum pattern width which may be processed by the lithography technique (that is, the pattern width may be at or near the resolution limit of the lithography technique). Next, the patterned first film having the first width is subjected to a slimming treatment (feature trimming) to be processed to have a second width that is the half of the first width, thereby forming core material patterns.

Thereafter, on the core material patterns formed by the first film on the film to be processed, the second film is conformally formed to have a film thickness having the same dimension as the second width. Subsequently, the second film is subjected to an etch-back treatment such that the second film having the second width remains as a sidewall spacer on both sidewalls of the core material patterns (the first film). Thereafter, the core material patterns formed by the first film now interposed between the sidewall spacers are selectively removed. Accordingly, the hard mask having the line-and-space pattern in which the second films having the second width formed as the sidewall spacers are disposed at an interval of the second width is obtained. By etching the film to be processed (i.e., a film below the second film) using the second films formed as the sidewall spacers as the hard mask, the film to be processed may be patterned into the line-and-space pattern having the second width as both the line width dimension and the line spacing dimension.

In addition, in a case of forming a finer line-and-space pattern, a processing film which becomes the core material is formed instead of the film to be processed, and the manufacturing process described above is repeated, thereby forming a line-and-space pattern having a width that is the half thereof.

In addition, in the above description, the case where the first film and the second are used as the processing films is described. However, a third film may be formed on the upper surface of the film to be processed and the third film may be patterned using the second film processed as the sidewall spacer as the hard mask, thereby forming a hard mask. In this case, the hard mask may be formed by providing the three types of processing films (the first to third films) of materials capable of achieving a high etching selectivity therebetween. In addition, the material of the third film may be selected to achieve an etching selectivity between the third film and the film to be processed.

Next, the process of forming the hard mask illustrated in FIG. 4 will be described with reference to FIGS. 7 to 10. In this case, a stacked film that forms the above-described word lines WL is disposed on the base as the film to be processed.

As illustrated in FIG. 7, the first film which becomes the core material is formed on the upper surface of the film to be processed, and the first film is etched to be processed into a line-and-space pattern by a lithography technique. In this case, core material patterns 21 having a width dimension (2×d) are formed in the memory cell region MA, and core material patterns 22 having a width dimension (d+s) are formed in the dummy region DA. The line-and-space pattern is formed in a range within the resolution limit of the photolithography technique. Here, the width dimension d is a dimension based on a pattern width dimension d as the first width formed as the final line-and-space pattern. In addition, the width dimension s corresponds to the second width set to a smaller dimension than the width dimension d.

Next, as illustrated in FIG. 8, the core material patterns 21 and 22 are subjected to the slimming treatment (trimmed) to be processed to have the width dimension d which is the half thereof. Accordingly, the core material patterns 21 become core material patterns 21a having the width dimension d, and the adjacent core material patterns 21a are disposed in a state of being separated from each other at an interval (3×d). In addition, the core material patterns 21b become core material patterns 22a having the width dimension s, and the adjacent core material patterns 22a are disposed in a state of being separated from each other at an interval (2×d+s).

Subsequently, as illustrated in FIG. 9, sidewall patterns 23 and 24 having the width dimension d are formed by the second film. For this, the second film is first formed conformally over the entire surface to have a film thickness d, and thereafter, the second film is subjected to the etch-back treatment to form the spacer shapes on the sidewalls of the core material patterns 21a and 22a. Accordingly, the sidewall patterns 23 having the width dimension d are formed on both sidewalls of the core material patterns 21a, and the sidewall patterns 24 having the width dimension d are formed on both sidewalls of the core material patterns 22a.

At this time, the two adjacent sidewall patterns 23 have a disposition (spacing) interval of a dimension d. In addition, the two adjacent sidewall patterns 24 have a disposition (spacing) interval of a dimension s in any of a part where the core material patterns 22a are present.

Next, as illustrated in FIG. 10, the core material patterns 21a and 22a are selectively removed by etching such that the sidewall patterns 23 and 24 remain on the film to be processed. Accordingly, the sidewall patterns 23 and 24 having the width dimension d as the hard mask for etching the film to be processed may be obtained. As a result, in the memory cell region MA, as the sidewall patterns 23, a hard mask for forming a line-and-space pattern having the width dimension d and a disposition interval d is obtained. In addition, in the dummy region DA, as the sidewall patterns 24, a hard mask for forming a line-and-space pattern having the width dimension d and a disposition interval s is obtained.

In this manner, the sidewall patterns 23 and 24 are formed as the hard mask. Therefore, the patterns may be formed so that the surface area per unit area in the dummy region DA is greater than that in the memory cell region MA. Accordingly, the film to be processed may be patterned into the line-and-space pattern having the second width d uniformly across the memory cell region MA.

In addition, in the above-described embodiment, the case where the sidewall transfer technique is used is exemplified. However, the embodiment may also be applied to patterning by a conventional photolithography technique in which the sidewall transfer technique is not used. For example, when within the patterning resolution limit of photolithographic technique, dummy lines having a smaller width than that of the word line WL in the memory cell region MA may be patterned in the dummy region DA with a smaller disposition interval than between the word line WL in the memory cell region MA (a pattern corresponding to the patterns of FIG. 7) Or alternatively, the dummy lines may have the same width d as the word lines WL and the spacing (disposition interval) between dummy lines in the dummy region DA may be less than the spacing (disposition interval)of the word lines WL in the memory cell region MA (a pattern corresponding to the patterns of FIG. 6).

(Second Embodiment)

FIGS. 11 to 19 illustrate a second embodiment. In this embodiment, the pattern disposition interval in the B direction of the line-and-space pattern is not varied, but patterning is performed such that the surface area of the dummy region DA is greater than that of the memory cell region MA for achieving the same line-and-space pattern disposition in the memory cell region MA.

Figure 11:
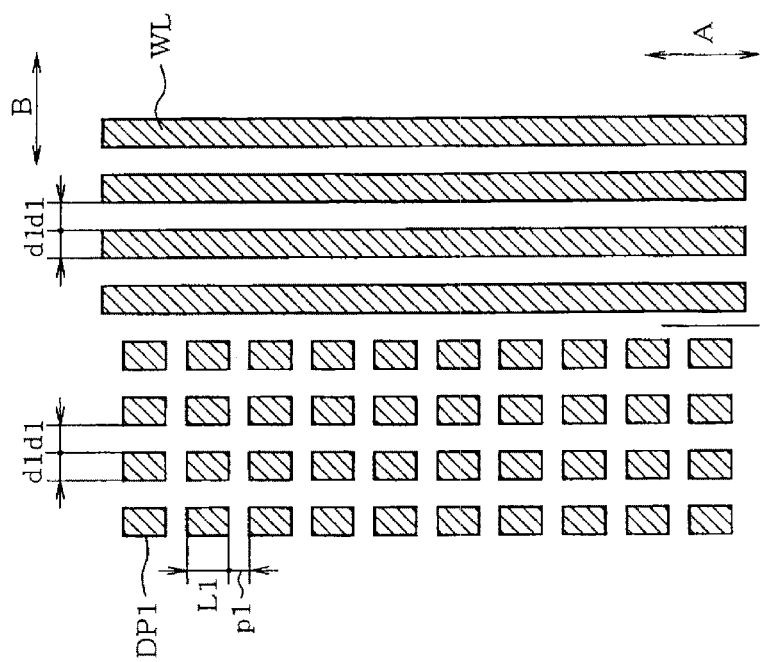
FIG. 11 is an example of a plan view illustrating patterns of the dummy region adjacent to the memory cell region according to a second embodiment.

That is, FIG. 11 is a diagram in which the dummy region DA provided with dummy patterns is disposed as the second region in a region adjacent to the memory cell region MA as the first region. In the memory cell region MA, the word lines WL that extend in the A direction are disposed to be lined up to have a pattern width d1 at an interval d1 in the B direction (i.e., 1:1 L/S pattern). Contrary to this, in the dummy region DA adjacent to the memory cell region MA, dummy patterns DP1 are disposed.

The dummy patterns DP1 have the pattern width d1 and the pattern interval d1 in the A direction like the word lines WL. The dummy patterns DP1 are disposed to have a length L1 and are separated at a disposition interval p1 in the A direction, which is a direction in which the word lines WL extend (perpendicular to the B direction). The length L of the dummy pattern DP1 is greater than the pattern width d1, and the disposition interval p1 is shorter than the pattern width d1. The number of columns in the B direction of the dummy patterns DP1 provided in the dummy region DA is set to a number of columns such that strain does not occur during pattern formation in the memory cell region MA. In addition, a single word line WL or a plurality of word lines WL at the end portion of the memory cell region MA may be used for element formation or for dummy formation.

By using the semiconductor substrate W in which the dummy patterns DP1 are disposed in the dummy region DA as described above, the surface area of the patterns on the semiconductor substrate W per unit area of the dummy region DA may be greater than that of the memory cell region MA as in the first embodiment. This will be described hereinafter by using FIG. 12.

Figure 12:
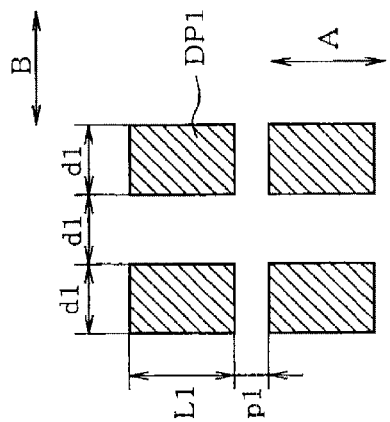
FIG. 12 is an example of an explanatory view for comparison between surface areas in a case where etching is performed on the patterns.

FIG. 12 illustrates a disposition of the dummy patterns DP1 formed in the dummy region DA. As described above, when the surface area of the patterns per unit area is considered, since the areas of the planar parts in the memory cell region MA and the dummy region DA are the same, a difference in side surface of the patterns becomes a difference in surface area. When it is assumed that the height dimensions of the patterns in the cell region MA and the dummy region DA are the same, it may be said that a difference between the surface areas of the sidewall surfaces of the patterns becomes a difference between the length dimensions of the contours of parts corresponding to the sidewalls of the patterns. Here, the total length of the contours of the patterns is considered. Here, contour refers to the perimeter of the patterns when viewed in a plan view, and total length of the contours of the patterns refers to cumulative distance resulting from adding up each individual pattern perimeter.

First, when a case where the number of separation parts (spaces between dummy patterns DP1 in the A direction) that form the dummy patterns DP1 per unit area is one, a length Ls of the contours of the sidewalls is reduced by (2×p1) due to the presence of the separation part, and however new sidewalls are also formed by presence of the separation part and the length Ls is thusly increased by (2×d1) due to the sidewalls that are newly formed. Therefore, when the difference between the two is obtained, it may be seen that the length Ls is changed by 2×(d1−p1).

This condition is a condition in which the disposition interval p1 in the A direction is necessarily smaller than the disposition interval d1 (d>p1) in the dummy patterns DP1 in the dummy region DA. By forming the dummy patterns DP1 separated to satisfy this condition, the length Ls of the contours that form the sidewalls maybe increased. In addition, as the number of separated parts that are present per unit area is increased, the length Ls of the contours may be increased.

Therefore, it may be seen that the length Ls of the contours is increased by an increase in the number of separated parts, which is caused by reducing the length L1 of the dummy patterns DP1 in the direction of the word line WL direction, and is increased as the disposition interval p1 between the dummy patterns DP1 is reduced. By providing the dummy patterns DP1 as described above, the surface area of the patterns in the dummy region DA may be greater than that in the memory cell region MA, thereby obtaining the same actions and effects as those of the first embodiments.

Next, the manufacturing process of the dummy patterns DP1 described above will be schematically described with reference to FIGS. 13 and 14, and a separating process will be described in detail with reference to FIGS. 15 to 19. First, as illustrated in FIG. 13, the first film is formed on the upper surface of the film 30 to be processed, which becomes the base, and the first film is processed into line-and-space patterns 31a and 31b that extend in the A direction, by the photolithography technique. The line-and-space patterns 31a and 31b respectively correspond to the memory cell region MA and the dummy region DA and are disposed at the disposition interval d1 in the B direction.

Next, as illustrated in FIG. 14, the memory cell region MA and other parts are covered with a resist and resist patterns for separation are formed in the line-and-space pattern 31b of the dummy region DA by the photolithography technique. The line-and-space pattern 31b is etched to be separated (in the A direction) by using the resist patterns as a mask, thereby forming dummy patterns 32. Accordingly, dummy patterns DP1 are formed.

In the pattern forming process, in a case where the line-and-space patterns 31a and 31b are patterned to have dimensions at the exposure limit (resolution limit) of the photolithography technique, during photolithography for separating the dummy region DA, the patterning is desirable performed at a width that is beyond the resolution limit (i.e., p1<d), and thus it is difficult to perform this processing. However, in this embodiment, patterning is performed as follows.

Figure 15A:
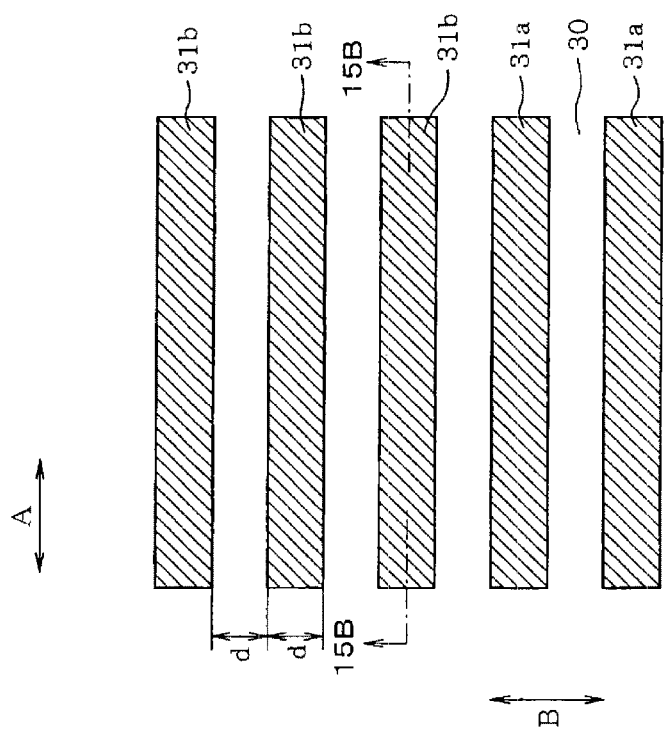
FIG. 15A is an example of a plan view illustrating a stage of a manufacturing process of forming pattern cuts.
Figure 15B:
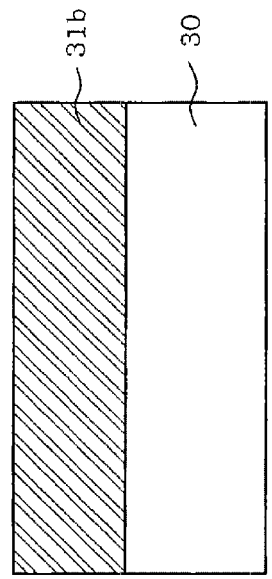
FIG. 15B is an example of a longitudinal cross-sectional view of a part taken along line 15B-15B in FIG. 15A (part 1).

First, FIGS. 15A and 15B illustrate a state where the line-and-space patterns 31a and 31b are formed on the base substrate 30 in the boundary region between the memory cell region MA and the dummy region DA. FIG. 15A illustrates a plan view of the line-and-space patterns 31a and 31b. FIG. 15B illustrates a cross-sectional view of a part of the line-and-space pattern 31b taken along line 15B-15B in FIG. 15A. Hereinafter, in FIGS. 16 to 18, partial diagrams A and B illustrate diagrams corresponding to the above parts in the same manner. FIGS. 15A and 15B illustrate a state where the line-and-space patterns 31a and 31b that are disposed to extend in the A direction are disposed to have the width dimension d1 and the disposition interval d1 in the B direction.

Figure 16B:
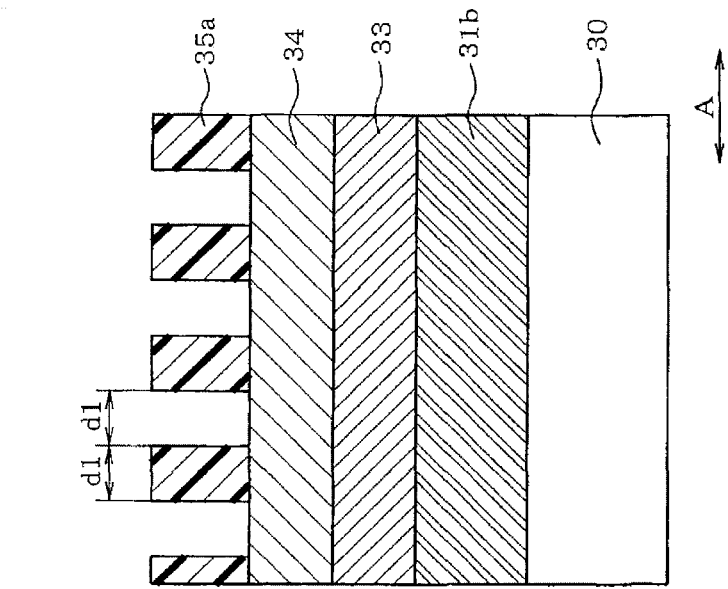
FIG. 16B is an example of a longitudinal cross-sectional view of a part taken along line 16B-16B in FIG. 16A (part 2).
Figure 16A:
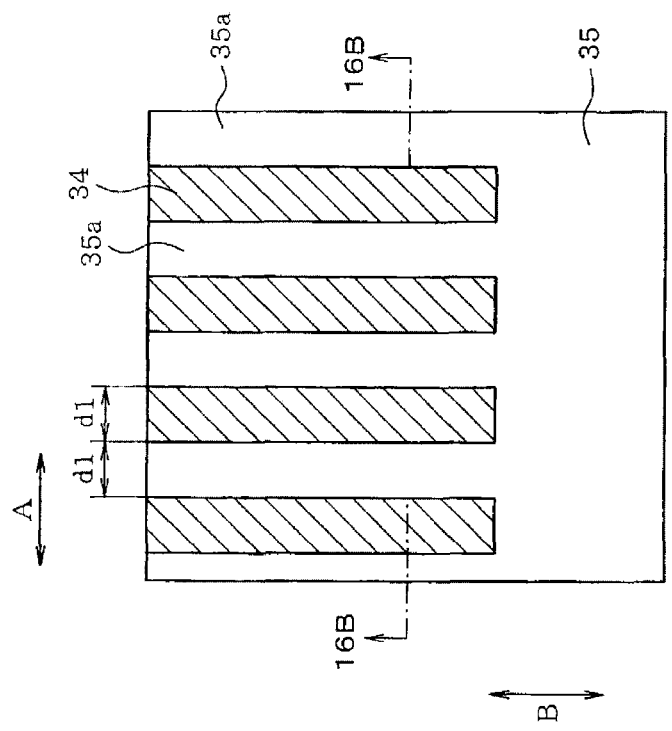
FIG. 16A is an example of a plan view illustrating a stage of the manufacturing process of forming pattern cuts.

Next, as illustrated in FIGS. 16A and 16B, three layers of resist films 33, 34, and 35 are formed on the upper surface of the above configuration by the photolithography technique. A lower resist film 33 is formed on the line-and-space patterns 31a and 31b, a SOG (spin on glass) film 34 is formed on the upper surface thereof, and an upper resist film 35 is formed on the upper surface thereof. The upper resist film 35 is formed by exposure and developing treatments so that comb-shaped separation patterns 35a are disposed in the A direction to have the width dimension d1 at the disposition interval d1 in the A direction in a part corresponding to the line-and-space pattern 31b. In separated parts (spaces between protrusions) of the upper resist 35, the upper surface of SOG film 34 is exposed.

Next, as illustrated in FIGS. 17A and 17B, the SOG film 34 and the lower resist film 33 are patterned using the upper resist film 35 as a mask. At this time, in the patterning treatment of the SOG film 34 and the lower resist film 33, the films are formed under the condition in which the separation width decreases from the upper portion toward the bottom surface portion of the pattern, thereby forming tapered surfaces (sloped sidewall surfaces). Accordingly, the SOG film 34 is formed into patterns 34a having the tapered surfaces and is patterned so that the lower surface portion has small opening widths. Furthermore, the lower resist film 33 is formed into patterns 33a that are patterned to have smaller opening widths than those of the openings of the SOG film 34. At this time, the lower resist film 33a is processed so that, with respect to the width dimension d1 of the upper surface portion, the width dimension of the bottom surface portion in the A direction is about L1, and the width dimension of the opening is p1.

Figures 18A, 18B:
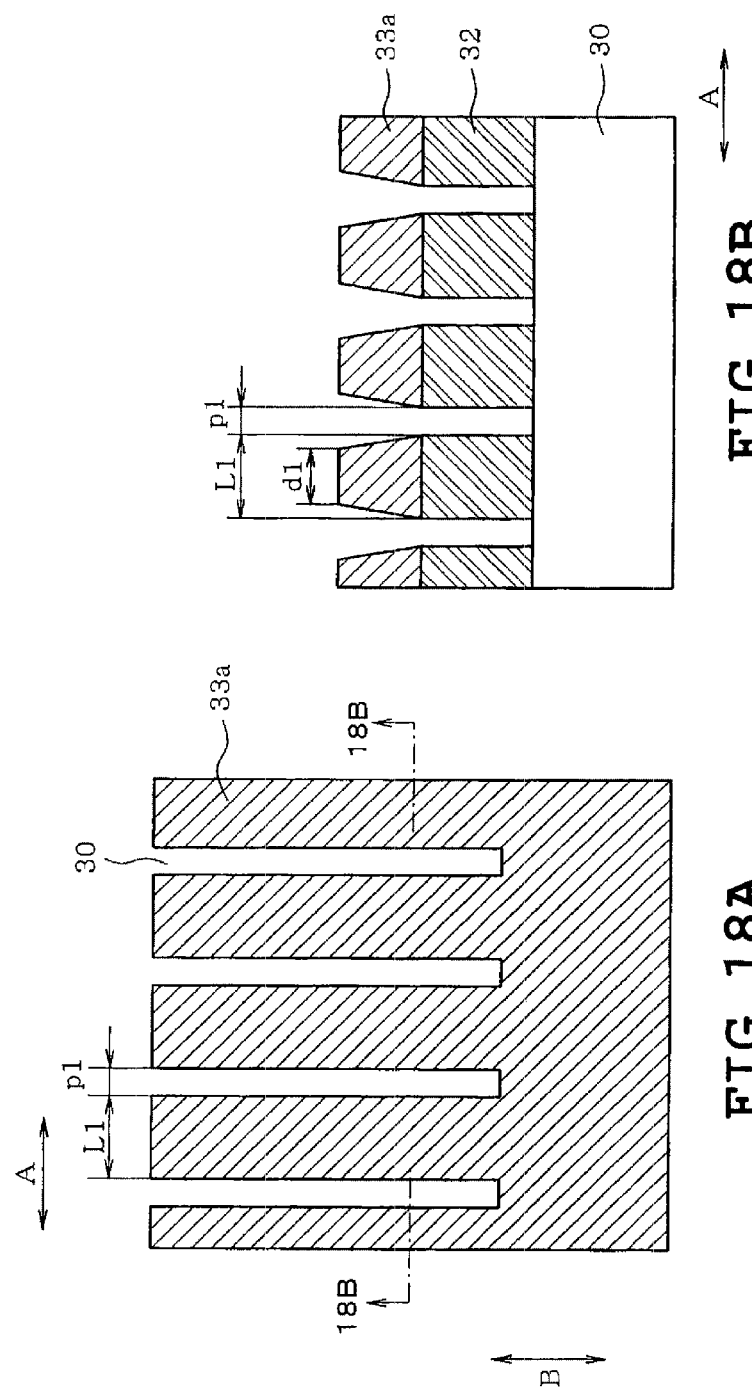
FIG. 18A is an example of a plan view illustrating a stage of the manufacturing process of forming pattern cuts.
FIG. 18B is an example of a longitudinal cross-sectional view of a part taken along line 18B-18B in FIG. 18A (part 4).

Next, as illustrated in FIGS. 18A and 18B, the line-and-space pattern 31b is processed using the patterns 33a of the lower resist film 33 as a mask. Accordingly, the line-and-space pattern 31b disposed to extend in the A direction is separated to have a length L1 and a disposition interval p1, thereby forming dummy patterns 32 (DPI). Subsequently, as illustrated in FIGS. 19A and 19B, by peeling off the lower resist film 33 and the patterns 33a, the dummy patterns 32 (DP) are formed on the base substrate 30.

Even in the second embodiment, the same actions and effects as those of the first embodiment may be obtained, and the surface area may be increased by the separating treatment performed to a degree equal to or less than the exposure limit of the photolithography.

(Third Embodiment)

FIGS. 20 to 29 illustrate a third embodiment. In this embodiment, a sidewall transfer technique is used on the patterns formed in the second embodiment in order to cause the pattern width that may be formed by the photolithography technique to be finer. In this case, two types of patterns are formed. One is separation type dummy patterns DP2 and the other is integration type dummy patterns DP3.

FIG. 20 illustrates the word lines WL and the dummy patterns DP2 that are formed to be finer (to have smaller feature dimension) by applying the sidewall transfer technique to the dummy patterns DP1 (see FIG. 11) in the second embodiment, and illustrates the dummy patterns DP2 disposed separated from each other. In this embodiment, the word lines WL of the memory cell region MA are disposed to have a pattern width d2 at a disposition interval d2.

A width dimension d2 of the word line WL is formed to be a width dimension (d2=d1/2=0.5×d1) which is about the half of the pattern width d1 in the second embodiment. In addition, the dummy pattern DP2 is disposed in a shape that forms a rectangular ring shape having the interior width dimension d2 in the B direction. As depicted in FIG. 20, the external width dimension of the dummy pattern DP2 is 3×d2 as each sidewall of the rectangular ring shape has width in the B direction of d2. In addition, an external dimension of the dummy pattern DP2 along the A direction in which the word line WL extends is L2, and a disposition interval p2 between the dummy patterns DP2 in the A direction is smaller than the width dimension d2 (p2<d2).

Since the dummy patterns DP2 are disposed as described above, it maybe seen from the disposition of the dummy patterns DP2 that the dummy patterns DP1 as in the second embodiment are included in an initial processing. Therefore, in an etching process before the dummy patterns DP2 are formed, the same actions and effects as those of the second embodiment may be obtained. Since the processing is performed by further using the sidewall transfer technique, the dummy patterns DP2 are similarly formed in the dummy region DA. Therefore, it may be seen that the disposition of the dummy patterns DP2 brings the same effects as those of the second embodiment.

Next, the integration type dummy patterns DP3 illustrated in FIG. 21 will be described. The dummy patterns DP3 have ladder shapes (ladder-shaped patterns) in which the above-described dummy patterns DP2 are integrated to overlap in the A direction. That is, this is a case where the disposition interval p2 between the dummy patterns DP2 that are adjacent to each other in the extension direction of the word lines WL is equal to zero. This is caused by setting the disposition interval of the original dummy patterns DP1 illustrated in the second embodiment to a dimension p1s which is smaller than p1(p1s<p1), when the sidewall patterns are formed by using the sidewall transfer technique.

Therefore, even in a case where the integration type dummy patterns DP3 are disposed in the dummy region DA, in the initial processing, the same conditions as those of the second embodiment are established. Therefore, in the etching process, the same actions and effects as those of the second embodiment maybe obtained. Since the processing is performed by further using the sidewall transfer technique using the patterns formed as a result, the dummy patterns DP3 are consequently formed in the dummy region DA. Therefore, it may be seen that the disposition of the dummy patterns DP3 brings the same effects as those of the second embodiment.

Figure 22:
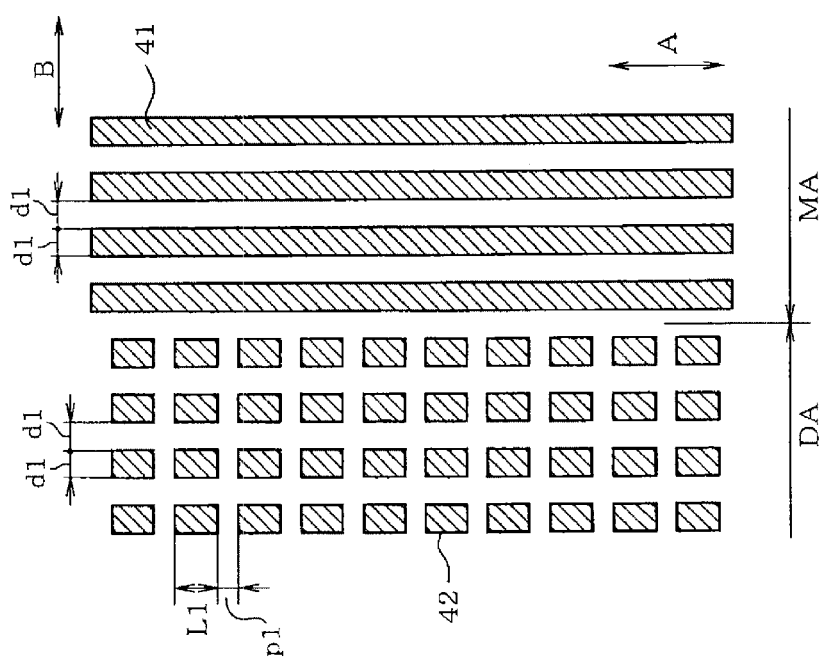
FIG. 22 is an example of a plan view illustrating a stage of a manufacturing process of the patterns of FIG. 20 (part 1).

Next, the manufacturing process of the dummy patterns DP2 will be described with reference to FIGS. 22 to 25. FIG. 22 illustrates core material patterns 41 corresponding to the word lines WL formed in the second embodiment (see FIG. 11) and dummy core material patterns 42 corresponding to the dummy patterns DP1. In this embodiment, as the core material patterns 41 and the dummy core material patterns 42, a processing film made of a core material pattern material for processing is formed on the upper surface of the film to be processed for pattern formation. The dimensions and the disposition states of the core material patterns 41 and the dummy core material patterns 42 are initially the same as the word lines WL and the dummy patterns DP1 illustrated in FIG. 11.

Figure 23:
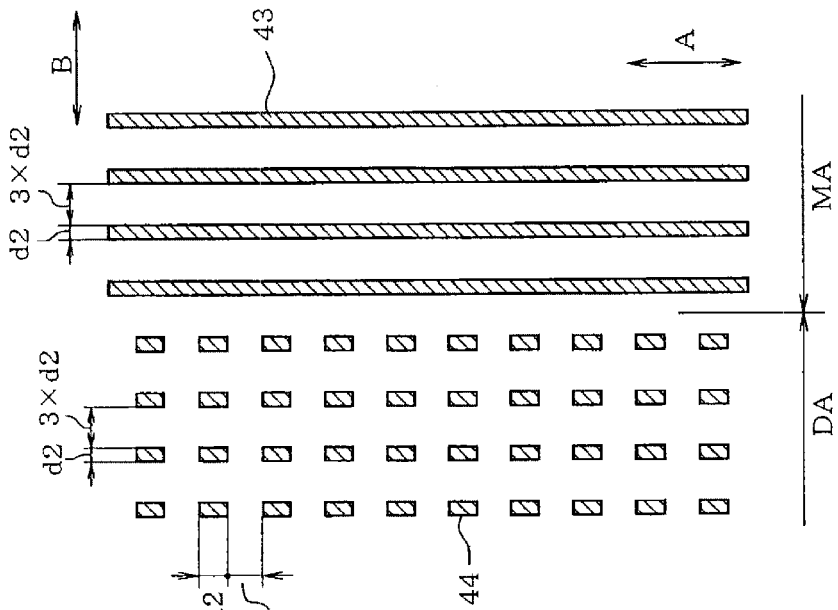
FIG. 23 is an example of a plan view illustrating a stage of the manufacturing process of the patterns of FIG. 20 (part 2).

Next, as illustrated in FIG. 23, the core material patterns 41 and the dummy core material patterns 42 are subjected to the slimming treatment. A slimming amount in this example is an amount that is approximately half of the pattern width d1. That is, the core material patterns 41 having the pattern width d1 are processed into the core material patterns 43 having the pattern width d2 (d2=d1/2) by the slimming treatment. Simultaneously, the dummy core material patterns 42 having the pattern width d1 and the length L1 are processed into the dummy core material patterns 44 having the pattern width d2 and a length (L1−d2) by the slimming treatment. Accordingly, the distance between the core material patterns 43 adjacent to each other in the B direction becomes (3×d2), and in the same manner, the distance between the dummy core material patterns 44 adjacent to each other in the B direction also becomes (3×d2). In addition, the distance between the dummy core material patterns 44 adjacent to each other in the A direction in which the word lines WL of the core material patterns 43 extend becomes (p1+d2).

Next, as illustrated in FIG. 24, sidewall patterns 45 and 46 having the width dimension d2 are formed using a deposited film. For this, first, the film for sidewall formation is formed (conformally or substantially so) on the entire surface to have a film thickness d2, and thereafter, the film is subjected to etch-back treatment to produce spacer shapes on the sidewalls of the core material patterns 43 and the dummy core material patterns 44. Accordingly, the sidewall patterns 45 having the width dimension d2 are formed on both sidewalls of the core material patterns 43, and the sidewall patterns 46 having rectangular ring shapes with the width dimension d2 are formed on the outer walls of the rectangular dummy core material patterns 44.

At this time, spaces between the sidewall patterns 45 adjacent to one another in the B direction of the memory cell region MA are at intervals having the dimension d2. In addition, the sidewall patterns 46 having the rectangular ring shapes in the dummy region DA are disposed to be lined up in the B direction to have the width dimension (3×d2) at the disposition interval d2, and are disposed to have a length dimension L2 (L2=L1+d2) at a disposition interval p2 (p2=p1−d2) in the A direction.

In addition, the sidewall patterns 46 having the rectangular ring shapes may be formed as the illustrated to be a separation type under the conditions in which the disposition interval p1 of the dummy core material patterns 42 formed in FIG. 22 in the A direction is smaller than the disposition interval d1, and (p1−d2) becomes positive. That is, the disposition interval p2 after formation becomes p2>0, that is, p1>d2 is achieved.

Next, as illustrated in FIG. 25, the core material patterns 43 and the dummy core material patterns 44a are selectively removed by etching to cause the sidewall patterns 45 and 46 to remain on the film to be processed. Accordingly, the sidewall patterns 45 and 46 having the width dimension d2 may be obtained as hard masks for etching the film to be processed. As a result, in the memory cell region MA, as the sidewall patterns 45, the hard mask for forming a line-and-space pattern having the width dimension d2 and the disposition interval d2 is obtained. In addition, in the dummy region DA, as the sidewall patterns 46 having the rectangular ring shapes, the hard mask having the width dimension d2 and the disposition interval p2 in the extension direction of the word lines WL is obtained.

Since the dummy patterns DP2 are disposed as described above, the following may be seen. That is, due to the disposition of the dummy patterns DP2, the same conditions as those of the second embodiment are established in the initial processing. Therefore, in the etching process, the same actions and effects as those of the second embodiment may be obtained. Since the processing is performed by further using the sidewall transfer technique using the patterns formed as a result, the dummy patterns DP2 are consequently formed in the dummy region DA. Therefore, it may be seen that the disposition of the dummy patterns DP2 brings the same effects as those of the second embodiment.

Next, the manufacturing process of the dummy patterns DP3 will be described with reference to FIGS. 26 to 29. FIG. 26 illustrates core material patterns 51 corresponding to the word lines WL formed in the second embodiment (see FIG. 11) and dummy core material patterns 52 corresponding to the dummy patterns DP1. In this embodiment, as the core material patterns 51 and the dummy core material patterns 52, the processing film made of the core material pattern material for processing is formed on the upper surface of the film to be processed for pattern formation. In addition, in this embodiment, the dummy core material patterns 52 have a disposition interval P1s in the A direction. The disposition interval P1s is smaller than the disposition interval p2 of the separation type dummy patterns DP2 described above and satisfies a relationship of p1s≤d2.

Next, as illustrated in FIG. 27, the core material patterns 51 and the dummy core material patterns 52 are subjected to the slimming treatment. A slimming amount is an amount that is approximately half of the pattern width d1. That is, the core material patterns 51 having the pattern width d1 are processed into the core material patterns 53 having the pattern width d2 (d2=d1/2=0.5×d1) by the slimming treatment. Simultaneously, the dummy core material patterns 52 having the pattern width d1 and the length L1 are processed into the dummy core material patterns 54 having the pattern width d2 and the length (L1−d2) by the slimming treatment. Accordingly, the distance between the core material patterns 53 adjacent to each other in the B direction becomes (3×d2), and in the same manner, the distance between the dummy core material patterns 54 adjacent to each other in the B direction also becomes (3×d2). In addition, the distance between the dummy core material patterns 54 adjacent to each other in the A direction becomes (p1s+d2).

Figure 28:
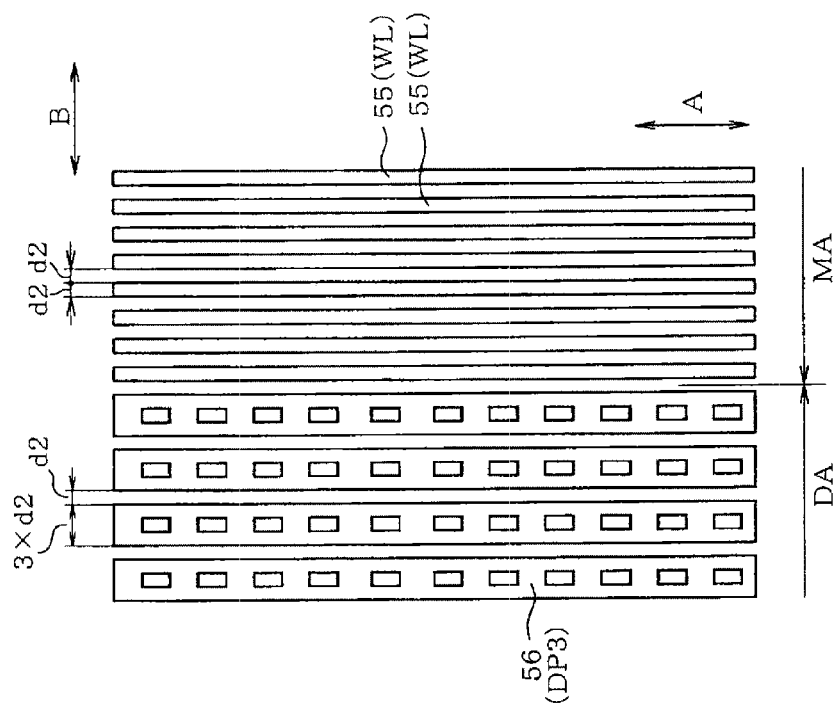
FIG. 28 is an example of a plan view illustrating a stage of the manufacturing process of the patterns of FIG. 21 (part 3).

Next, as illustrated in FIG. 28, sidewall patterns 55 and 56 having the width dimension d2 are formed. For this, first, the film for sidewall formation is formed (conformally or substantially so) on the entire surface to have a film thickness d2, and thereafter, the film is subjected to the etch-back treatment to produce the spacer shapes on the sidewalls of the core material patterns 53 and the dummy core material patterns 54. Accordingly, the sidewall patterns 55 having the width dimension d2 are formed on both sidewalls of the core material patterns 53, and the sidewall patterns 56 having the width dimension d2 are formed on the outer peripheral walls of the rectangular dummy core material patterns 54.

At this time, spaces between the sidewall patterns 55 adjacent to one another in the B direction of the memory cell region MA are provided at intervals having the dimension d2. In addition, since an interval dimension of the dummy core material patterns 54 in the A direction is (p1s+d2), the dimension is shorter than (2×d2), thereby forming a connected state. As a result, the sidewall patterns 56 having ladder shapes are formed. That is, the integration type dummy patterns DP3 are formed and correspond to the separation type dummy patterns DP2 which are connected in the A direction.

In addition, the sidewall patterns 56 having the ladder shapes (integration type dummy patterns) may be formed as the illustrated under the conditions in which the disposition interval p1s of the dummy core material patterns 52 formed in FIG. 26 in the direction in which the word lines WL extend is smaller than the disposition interval d1, and (p1s−d2) becomes zero or negative. That is, the disposition interval p1s after formation is p1s≥d2.

Figure 29:
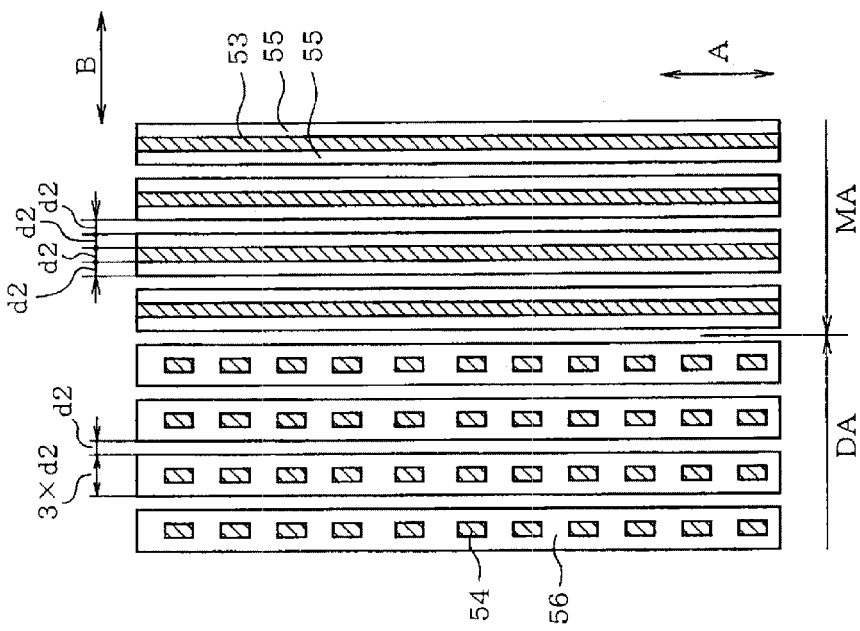
FIG. 29 is an example of a plan view illustrating a stage of the manufacturing process of the patterns of FIG. 21 (part 4).

Next, as illustrated in FIG. 29, the core material patterns 53 and the dummy core material patterns 54 are selectively removed by etching to cause the sidewall patterns 55 and 56 to remain on the film to be processed. Accordingly, the sidewall patterns 55 and 56 having the width dimension d2 may be obtained as hard masks for etching the film to be processed. As a result, in the memory cell region MA, as the sidewall patterns 55, the hard mask for forming a line-and-space pattern having the width dimension d2 and the disposition interval d2 is obtained. In addition, in the dummy region DA, as the sidewall patterns 56 having the ladder shapes, the hard mask having the width dimension d2 and an integrated shape in the A direction is obtained.

Since the dummy patterns DP3 are disposed as described above, due to the disposition of the dummy patterns DP3, the same conditions as those of the second embodiment are established in the initial processing. Therefore, in the etching process, the same actions and effects as those of the second embodiment may be obtained. Since the processing is performed by further using the sidewall transfer technique using the patterns formed as a result, the dummy patterns DP3 are consequently formed in the dummy region DA. Therefore, it may be seen that the disposition of the dummy patterns DP3 brings the same effects as those of the second embodiment.

(Fourth Embodiment)

FIGS. 30 to 56 illustrate a fourth embodiment. In this embodiment, an example is described where the sidewall transfer technique is used twice to further reduce pattern widths beyond that may which be formed by a photolithography technique alone and also finer than those in the third embodiment. In this case, three types of patterns are formed by the disposition condition for pattern formation. One is separation type dummy patterns DP4 and the others are integration type dummy patterns DP5 and DP6.

Figures 30, 31:
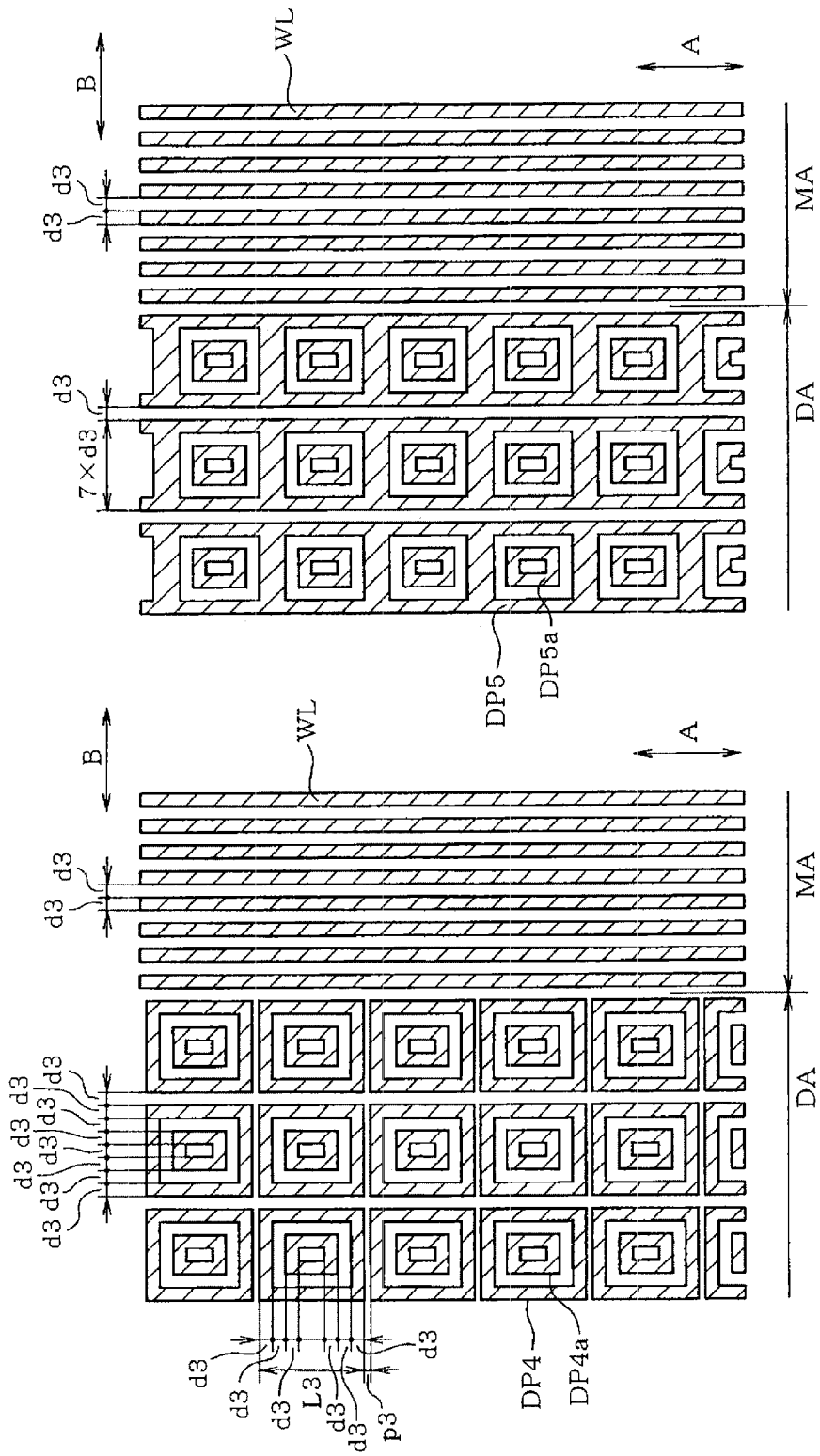
FIG. 30 is an example of a plan view illustrating patterns (part 1) of the dummy region adjacent to the memory cell region according to a fourth embodiment.
FIG. 31 is an example of a plan view illustrating patterns (part 2) of the dummy region adjacent to the memory cell region.

FIG. 30 depicts a case where the dummy patterns DP2 described in the third embodiment have been already caused to be finer by the sidewall transfer technique performed once, and illustrates the separation type dummy patterns DP4 disposed in a state in which the dummy patterns are separated from each other. In this embodiment, the pattern width of the word lines WL of the memory cell region MA is d3, and the disposition interval between the adjacent word lines WL is d3.

A width dimension d3 of the word line WL is formed to be a width dimension (d3=d2/2=d1/4), that is about the half of the pattern width d2 in the third embodiment in which the sidewall transfer technique is used once. In addition, the dummy patterns DP4 are formed in rectangular ring shapes in which the frames having the width dimension d3 are doubly disposed. In addition, an external form dimension of the dummy pattern DP4 along the A direction in which the word line WL extends is L3, and a disposition interval p3 between the dummy patterns DP4 along the A direction is smaller than the width dimension d3 (p3<d3).

Next, the integration type dummy patterns DP5 illustrated in FIG. 31 will be described. The dummy patterns DP5 have ladder shapes in which the rectangular ring-shaped parts on the outsides of the above-described dummy patterns DP4 overlap so as to be integrated in the A direction. In addition, a disposition state is achieved in which a dummy pattern DP5a having a rectangular ring shape is included inside the rectangular opening of the ladder-shaped dummy pattern DP5. The dummy patterns DP5 refer to a case where the disposition interval p3 between the dummy patterns DP4 that are adjacent to each other in the A direction is equal to or less than zero. This is caused by setting the disposition interval of the original dummy patterns DP1 illustrated in the third embodiment to a dimension p1s which is smaller than p1 (p1s<p1), when the sidewall patterns are formed by using the sidewall transfer technique.

Figure 32:
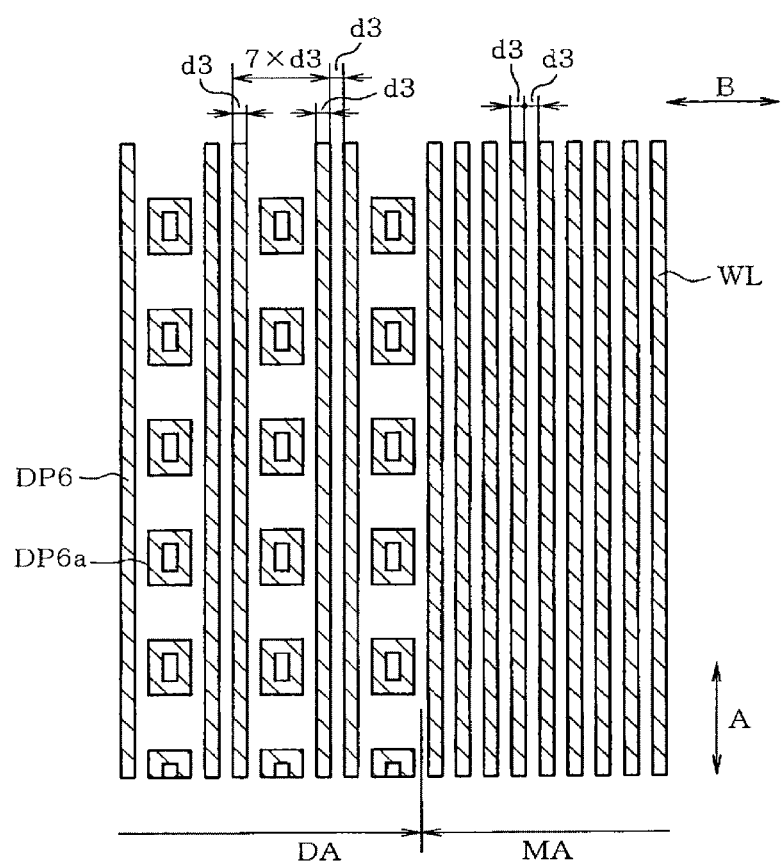
FIG. 32 is an example of a plan view illustrating patterns (part 3) of the dummy region adjacent to the memory cell region.

In addition, the other integration type dummy patterns DP6 illustrated in FIG. 32 refer to a case where parts of the integration type dummy patterns DP3 described in the third embodiment, which form the ladder shapes in the A direction so as to further overlap and disappear. Accordingly, repeating structures including the two dummy patterns DP6 having line shapes with the width dimension d3 like the word lines WL and dummy patterns DP6a having rectangular ring shapes disposed between the two dummy patterns DP6 are formed.

Figure 33:
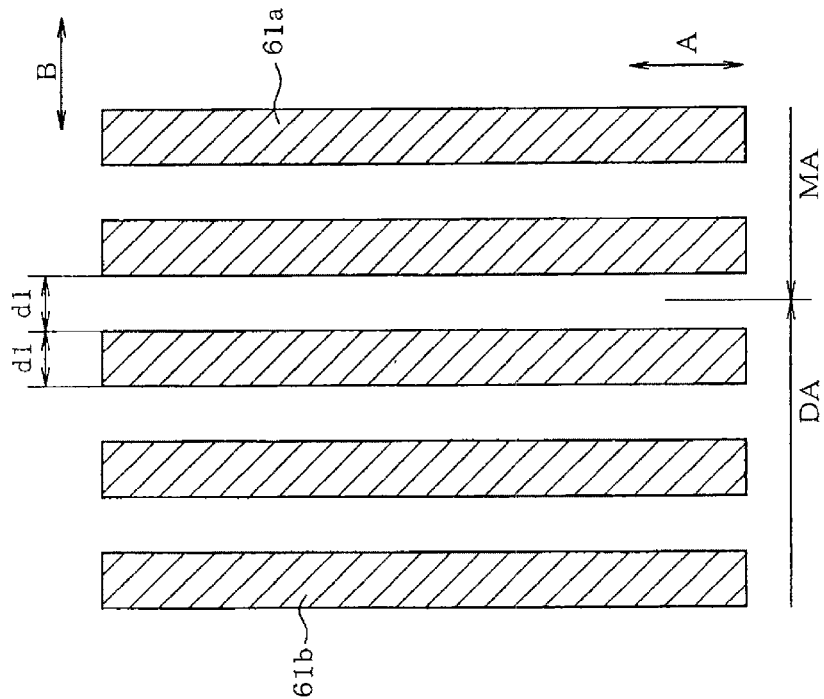
FIG. 33 is an example of a plan view illustrating a stage of a manufacturing process of the patterns of FIG. 30 (part 1).

Next, first, each manufacturing process of the separation type dummy patterns DP4 will be described with reference to FIGS. 33 to 40. FIG. 33 illustrate a state where line-and-space patterns 61a and 61b which become core material patterns are formed to have the pattern width d1 at the disposition interval d1. The line-and-space patterns 61a are disposed to correspond to the memory cell region MA, and the line-and-space patterns 61b are disposed to correspond to the dummy region DA. In addition, in this embodiment, the sidewall transfer technique is used twice. Therefore, a film which becomes the base is not the film to be processed, and a film for core material pattern formation is disposed to perform a subsequent sidewall transfer.

Figure 34:
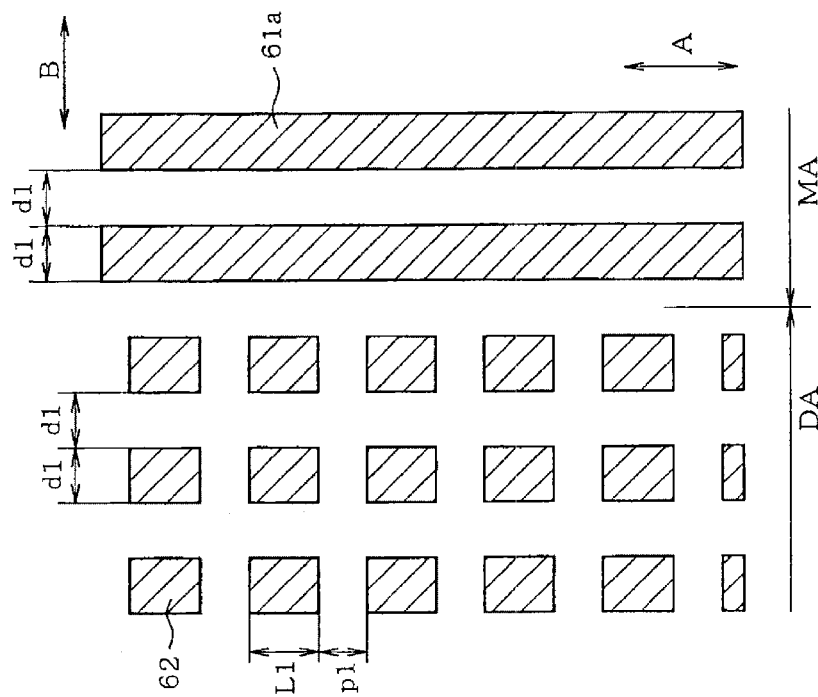
FIG. 34 is an example of a plan view illustrating a stage of the manufacturing process of the patterns of FIG. 30 (part 2).

Next, as illustrated in FIG. 34, by performing the same process as that of the second embodiment, the line-and-space patterns 61b of the dummy region DA are separated to form dummy core material patterns 62. Accordingly, the dummy core material patterns 62 are formed to have the length L1 in the A direction, and are disposed in a state having the disposition interval p1 from the adjacent dummy core material pattern 62.

Next, as illustrated in FIG. 35, the core material patterns 61a and the dummy core material patterns 62 are subjected to the slimming treatment. A slimming amount is an amount that is substantially the half of the pattern width d1. That is, the core material patterns 61a having the pattern width d1 are processed into the core material patterns 63 having the pattern width d2 (d2=d1/2) by the slimming treatment. Simultaneously, the dummy core material patterns 62 having the pattern width d1 and the length L1 are processed into the dummy core material patterns 64 having the pattern width d2 and the length (L1−d2) by the slimming treatment. Accordingly, the distance between the core material patterns 63 adjacent to each other in the B direction perpendicular to the word line WL becomes (3×d2), and in the same manner, the distance between the dummy core material patterns 44 adjacent to each other also becomes (3×d2). In addition, the distance between the dummy core material patterns 44 adjacent to each other in the A direction of the core material patterns 43 becomes (p1+d2).

Next, as illustrated in FIG. 36, sidewall patterns 65 and 66 having the width dimension d2 are formed by the film for sidewall formation. For this, first, the film for sidewall formation (conformal film) is formed on the entire surface to have the film thickness d2, and thereafter, the film is subjected to the etch-back treatment to remain in spacer shapes on the sidewalls of the core material patterns 63 and the dummy core material patterns 64. Accordingly, the sidewall patterns 65 having the width dimension d2 are formed on both sidewalls of the core material patterns 63, and the sidewall patterns 66 having rectangular ring shapes with the width dimension d2 are formed on the outer peripheral walls of the rectangular dummy core material patterns 64.

At this time, spaces between the sidewall patterns 23 adjacent to one another in the memory cell region MA are provided in a state in which all the disposition intervals in the B direction have the dimension d2. In addition, the sidewall patterns 66 having the rectangular ring shapes in the dummy region DA are disposed in the B direction to have the width dimension (3×d2) at the disposition interval d2, and are disposed to have the length dimension L2 (L2=L1+d2) at the disposition interval p2 (p2=p1−d2) in the A direction. Here, the width dimension of the rectangular ring shapes in the dummy region DA in the B direction refers to the outer width dimension of the ring shape—that is, in this instance the distance between outer edge to outer edge in the B direction is (3×d2) for the rectangular ring shapes of the sidewall patterns 66.

In addition, the sidewall patterns 66 having the rectangular ring shapes may be formed as the illustrated separation type under the conditions in which the disposition interval p1 of the dummy core material patterns 62 formed in FIG. 34 in the A direction is smaller than the disposition interval d1, and (p1−d2) becomes positive. That is, the disposition interval p2 after formation of p2>0, that is, p1>d2 are conditions to achieve the separation type.

Figures 37, 38:
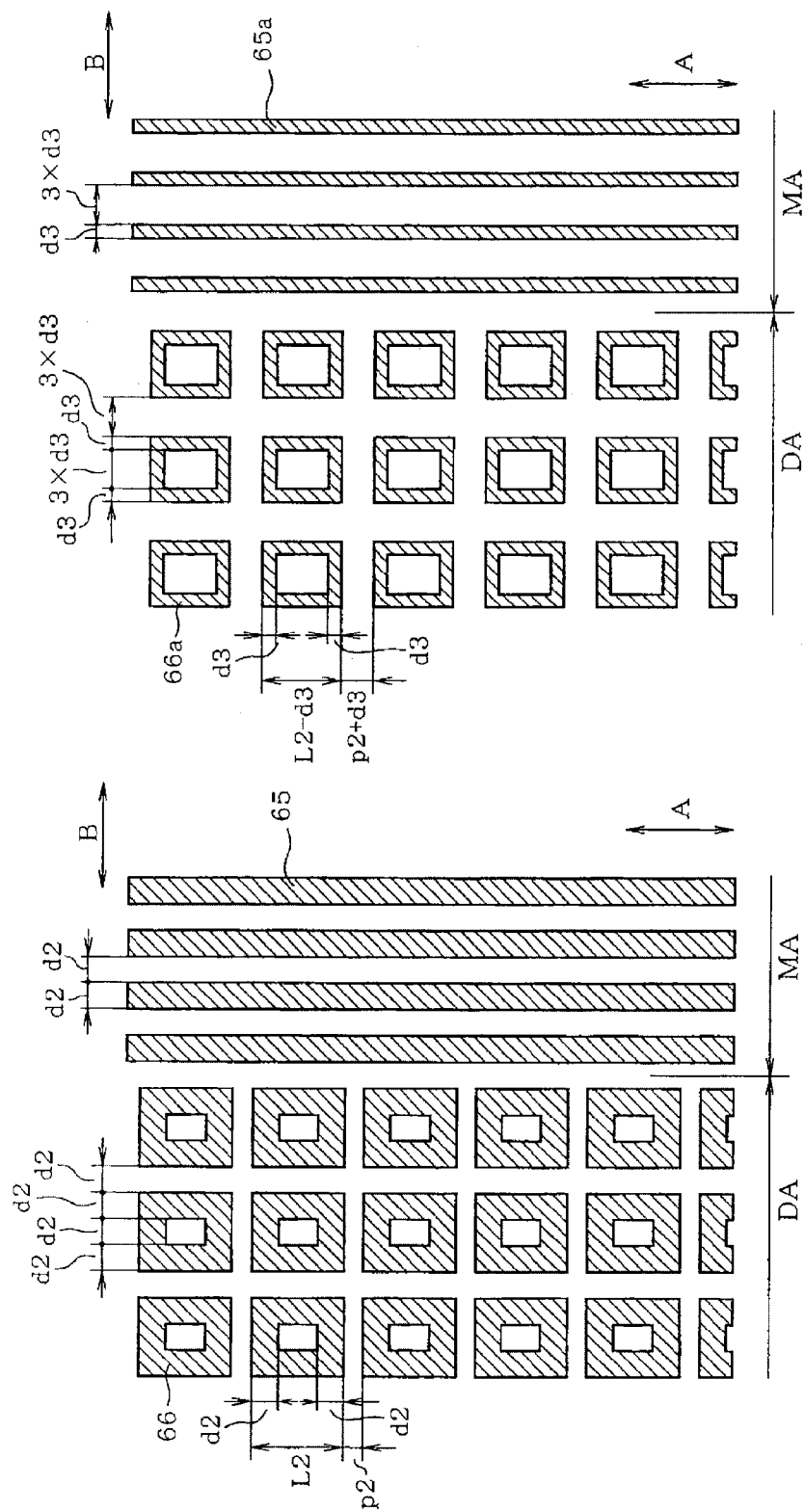
FIG. 37 is an example of a plan view illustrating a stage of the manufacturing process of the patterns of FIG. 30 (part 5).
FIG. 38 is an example of a plan view illustrating a stage of the manufacturing process of the patterns of FIG. 30 (part 6).

Next, as illustrated in FIG. 37, the core material patterns 63 and the dummy core material patterns 64 are selectively removed by etching to cause the sidewall patterns 65 and 66 to remain on the film to be processed. Accordingly, the sidewall patterns 65 and 66 having the width dimension d2 may be obtained as a processing film of the base. As a result, in the memory cell region MA, as the sidewall patterns 65, a hard mask for forming a line-and-space pattern having the width dimension d2 and the disposition interval d2 is obtained. In addition, in the dummy region DA, as the sidewall patterns 66 having the rectangular ring shapes, a hard mask having the width dimension (3×d2) and the disposition interval d2 in the B direction and having the length L2 and the disposition interval p2 in the A direction is obtained.

Next, by using the sidewall patterns 65 and 66 obtained as described above as the hard mask, a processing film for the core material patterns used for the second sidewall transfer, which becomes the base, is formed. In addition, here, for the purpose of illustrating a transition of planar processing, the processing film for the core material patterns is described using the same reference numeral.

As illustrated in FIG. 38, the core material patterns formed from the sidewall patterns 65 and 66 as described above are subjected to the slimming treatment. A slimming amount is an amount that is substantially the half of the pattern width d2. That is, the core material patterns having the pattern width d2 are processed into core material patterns 65a having the pattern width d3 (d3=d2/2=d1/4) by the slimming treatment. Simultaneously, the dummy core material patterns having the pattern width d2 and the length L2 are processed into dummy core material patterns 66a having the pattern width d3 and a length (L2−d3) by the slimming treatment. Accordingly, the distance between the core material patterns 65a adjacent to each other in the B direction perpendicular to the word line WL becomes (3×d3), and in the same manner, the distance between the dummy core material patterns 66a adjacent to each other also becomes (3×d3). In addition, the distance between those adjacent to each other in the A direction of the core material patterns 66a becomes (p2+d3).

Next, as illustrated in FIG. 39, sidewall patterns 67, 68, and 69 having the width dimension d3 are formed by the film for sidewall formation. For this, first, the film for sidewall formation is formed on the entire surface to have the film thickness d3, and thereafter, the film is subjected to the etch-back treatment to remain in spacer shapes on the sidewalls of the core material patterns 65a and the dummy core material patterns 66a. Accordingly, the sidewall patterns 67 having the width dimension d3 are formed on both sidewalls of the core material patterns 65a, and the sidewall patterns 68 and 69 having rectangular ring shapes with the width dimension d3 are respectively formed on the outer peripheral walls and the inner peripheral walls of the rectangular dummy core material patterns 66a.

At this time, spaces between the sidewall patterns 67 adjacent to one another in the memory cell region MA are provided in a state in which all the disposition intervals have the dimension d3. In addition, the sidewall patterns 68 having the rectangular ring shapes in the dummy region DA are disposed in the B direction perpendicular to the word lines WL to have a width dimension (7×d3) at the disposition interval d3, and are disposed to have a length dimension L3 (L3=L2+d3) at the disposition interval p3 (p3=p2−d3) in the A direction. In addition, the sidewall pattern 69 having the rectangular ring shape is disposed at a distance d3 inside the sidewall pattern 68.

In addition, the sidewall patterns 68 having the rectangular ring shapes may be formed as the illustrated separation type under the conditions in which the disposition interval p2 of the dummy core material patterns 66 formed in FIG. 37 in the A direction is smaller than the disposition interval d2, and (p2−d3) becomes positive. That is, the disposition interval p3 after formation becomes of p3>0, that is, p2>d3 are conditions to achieve the separation type.

Next, as illustrated in FIG. 40, the core material patterns 65a and the dummy core material patterns 66a are selectively removed by etching to cause the sidewall patterns 67, 68, and 69 to remain on the film to be processed. Accordingly, in the memory cell region MA, as the sidewall patterns 67, a hard mask for forming a line-and-space pattern having the width dimension d3 and the disposition interval d3 is obtained. In addition, in the dummy region DA, as the sidewall patterns 68 and 69 having the rectangular ring shapes, the dummy patterns DP4 in which the width dimension in the B direction is (7×d3), the length in the A direction is L3, and the disposition interval is p3 are obtained, and on the insides thereof, dummy patterns DP4a disposed to have the rectangular ring shapes with the width dimension d3 are obtained.

Since the dummy patterns DP4 and DP4a are disposed as described above, the same effects as those of the third embodiment may be obtained.

Next, each manufacturing process of the integration type dummy pattern DP5 will be described with reference to FIGS. 41 to 48. FIG. 41 illustrates a state where line-and-space patterns 71a and 71b which become core material patterns are formed to have the pattern width d1 at the disposition interval d1. The line-and-space patterns 71a are disposed to correspond to the memory cell region MA, and the line-and-space patterns 71b are disposed to correspond to the dummy region DA.

Next, as illustrated in FIG. 42, by performing the same process as that of the second embodiment, the line-and-space patterns 71b of the dummy region DA are separated to form dummy core material patterns 72. Adjacent dummy core material patterns 72 have the disposition interval p1s in the A direction. The disposition interval p1s is set to a dimension smaller than the disposition interval p1 in the separation type dummy patterns DP4 described above.

Next, as illustrated in FIG. 43, the core material patterns 71a and the dummy core material patterns 72 are subjected to the slimming treatment. Accordingly, the core material patterns 73 having the pattern width d2 (d2=d1/2) and the dummy core material patterns 74 having the pattern width d2 and the length (L1−d2) are formed. The distance between the dummy core material patterns 74 adjacent to each other in the A direction becomes (p1s+d2).

Next, the film for sidewall formation is formed and processed to form sidewall patterns 75 having the width dimension d2 and sidewall patterns 76 having rectangular ring shapes as illustrated in FIG. 44. The sidewall patterns 75 adjacent to each other in the memory cell region MA have the disposition interval d2. The sidewall patterns 76 having the rectangular ring shapes in the dummy region DA are disposed to have the width dimension (3×d2) at the disposition interval d2 in the B direction and are disposed to have the length dimension L2 (L2=L1+d2) at a disposition interval p2s (p2s=p1s−d2) in the A direction. In this case, the sidewall patterns 76 satisfy the conditions in which the disposition interval p1s between the dummy core material patterns 72 formed in the FIG. 42 in the A direction is smaller than the disposition interval d1 and (p1s−d2) becomes positive and thus are provided as the illustrated separation type.

Next, as illustrated in FIG. 45, the core material patterns 73 and the dummy core material patterns 74 are selectively removed by etching, and subsequently, as illustrated in FIG. 46, the core material patterns are subjected to the slimming treatment to form core material patterns 75a and dummy core material patterns 76a. The core material patterns 75a are formed to have the pattern width d3 (d3=d2/2=d1/4) at the disposition interval (3×d3) in the B direction. The dummy core material patterns 76a are formed to have the pattern width d3 and an external form dimension (outer width dimension) (5×d3) at the disposition interval d3 in the B direction. In addition, the dummy core material patterns 76a are formed to have the external form dimension (L2−d3) in the A direction at a disposition interval (p2s+d3).

Figure 47:
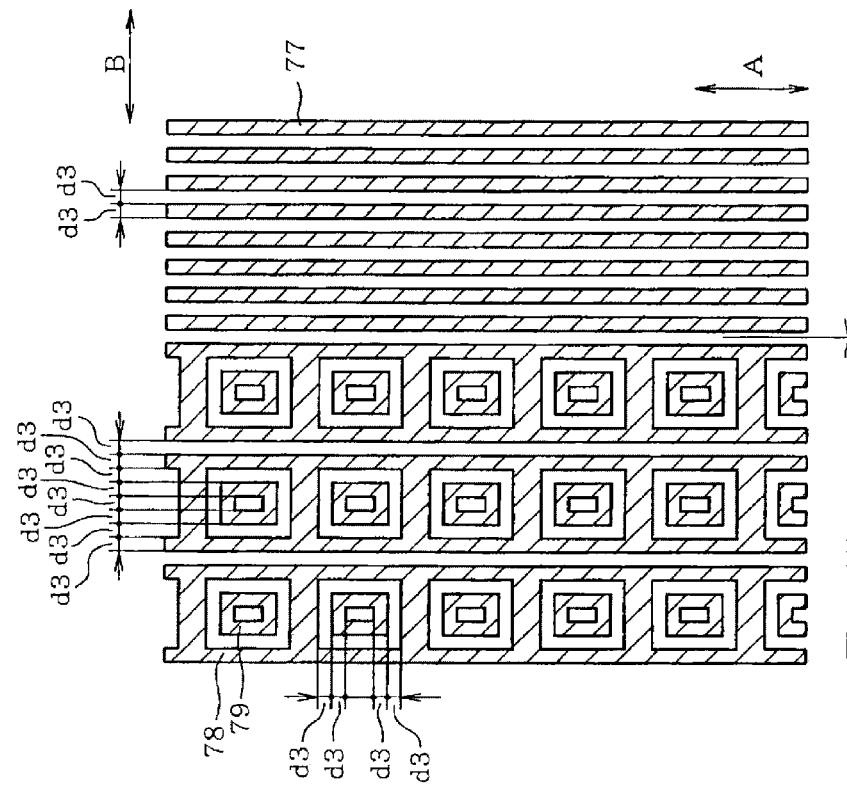
FIG. 47 is an example of a plan view illustrating a stage of the manufacturing process of the patterns of FIG. 31 (part 7).

Next, as illustrated in FIG. 47, sidewall patterns 77, 78, and 79 having the width dimension d3 are formed by deposition of the film for sidewall formation followed by etch back processing. The sidewall patterns 77 are formed on both sidewalls of the core material patterns 75a to have the width dimension d3. The sidewall patterns 78 are formed on the outer peripheral walls of the dummy core material patterns 76a to have the width dimension d3 and are formed in ladder shapes connected in the A direction. The sidewall patterns 79 are formed on the inner peripheral walls of the dummy core material patterns 76a to have the width dimension d3 in the rectangular shapes.

In this case, the sidewall patterns 78 having ladder shapes in the dummy region DA are disposed to have the width dimension (7×d3) in the B direction at the disposition interval d3, and are disposed in a connected state in the A direction (that is, sidewall patterns 78 are connected to sidewall patterns 78 adjacent in the in the A direction). In addition, the sidewall pattern 79 having the rectangular ring shape is disposed at the distance d3 inside the sidewall pattern 78. In addition, the sidewall patterns 68 having the rectangular ring shapes may be formed as the illustrated integration type under the conditions in which the disposition interval p2 of the dummy core material patterns 66 formed in FIG. 37 in the A direction is equal to or smaller than d3 (p2≤p3).

Figure 48:
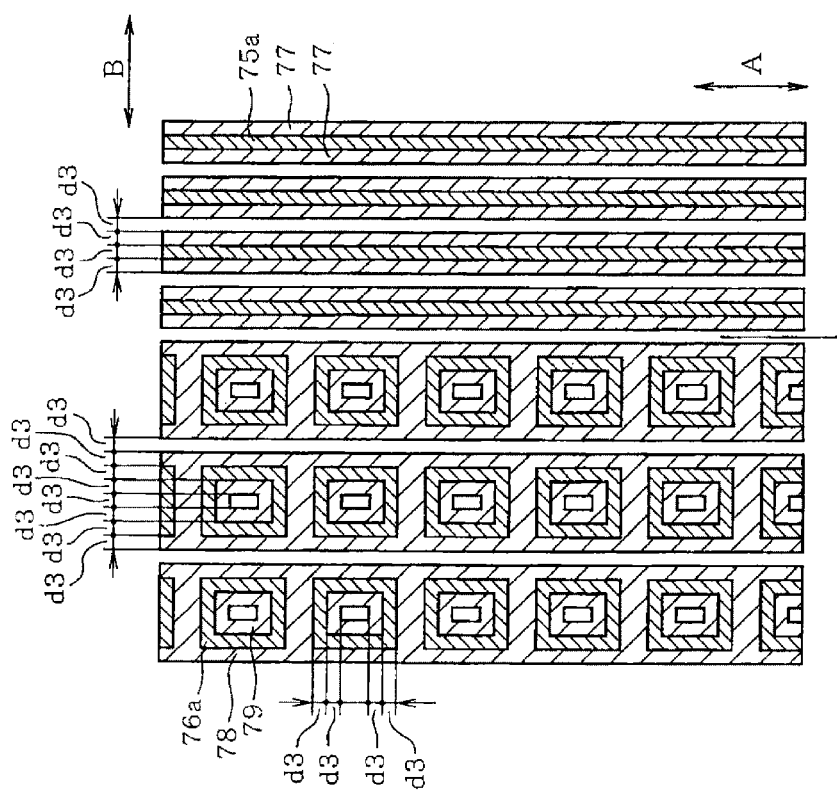
FIG. 48 is an example of a plan view illustrating a stage of the manufacturing process of the patterns of FIG. 31 (part 8).

Next, as illustrated in FIG. 48, the core material patterns 75a and the dummy core material patterns 76a are selectively removed by etching leaving the sidewall patterns 77, 78, and 79 on the film to be processed. Accordingly, in the memory cell region MA, as the sidewall patterns 77, a hard mask for forming a line-and-space pattern having the width dimension d3 and the disposition interval d3 is obtained. In addition, in the dummy region DA, as the sidewall patterns 78 having ladder shapes and the sidewall patterns 79 having rectangular shapes, the dummy patterns DP5 and DP5a having the width dimension d3 and the disposition interval p3 in the extension direction of the word lines WL, are obtained.

Since the dummy patterns DP5 and DP5a are disposed as described above, the same effects as those of the third embodiment may be obtained.

Figure 49:
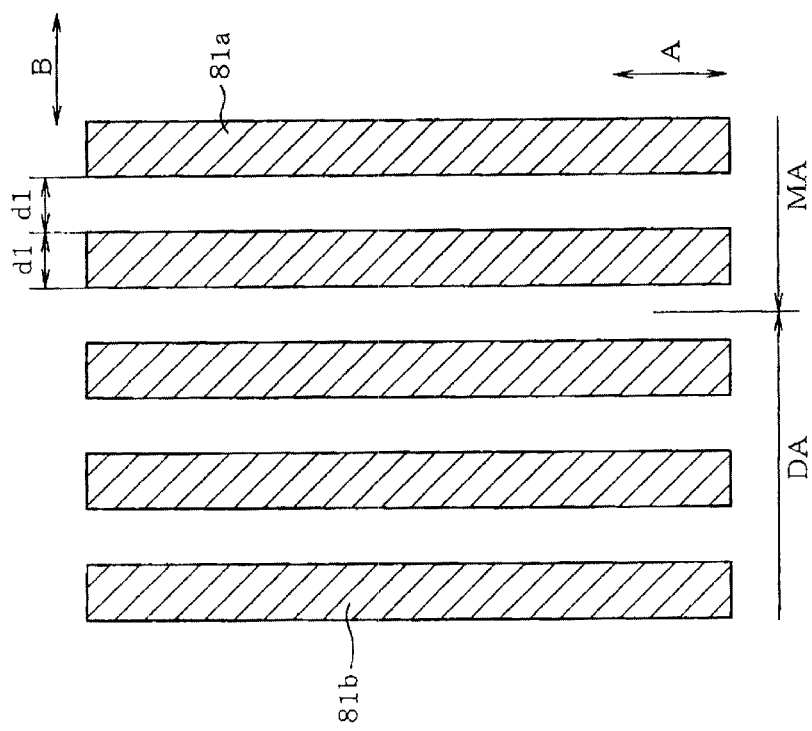
FIG. 49 is an example of a plan view illustrating a stage of a manufacturing process of the patterns of FIG. 32 (part 1).

Next, each manufacturing process of the integration type dummy pattern DP6 will be described with reference to FIGS. 49 to 56. FIG. 49 illustrates a state where line-and-space patterns 81a and 81b which become core material patterns are formed to have the pattern width d1 at the disposition interval d1. The line-and-space patterns 81a are disposed to correspond to the memory cell region MA, and the line-and-space patterns 81b are disposed to correspond to the dummy region DA.

Figure 50:
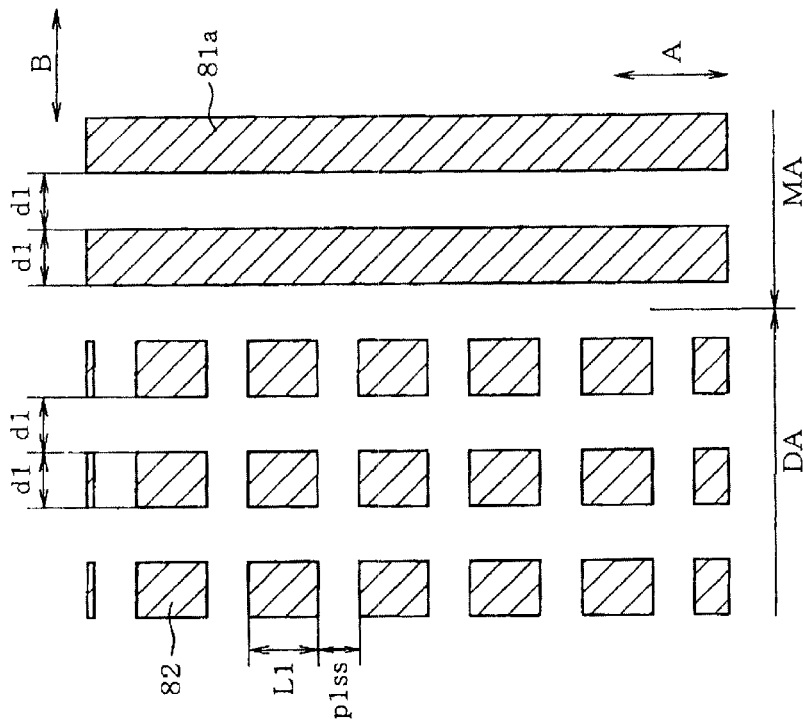
FIG. 50 is an example of a plan view illustrating a stage of the manufacturing process of the patterns of FIG. 32 (part 2).

Next, as illustrated in FIG. 50, by performing the same process as that of the second embodiment, the line-and-space patterns 81b of the dummy region DA are separated to form dummy core material patterns 82. The dummy core material patterns 82 have the disposition interval p1ss from the adjacent dummy core material pattern 82 in the A direction. The disposition interval p1ss is set to a dimension smaller than the disposition interval p1s in the integration type dummy patterns DP5 described above.

Next, as illustrated in FIG. 51, the core material patterns 81a and the dummy core material patterns 82 are subjected to the slimming treatment. Accordingly, the core material patterns 83 having the pattern width d2 (d2=d1/2=0.5×d1) and the dummy core material patterns 84 having the pattern width d2 and the length (L1−d2) are formed. The distance between the dummy core material patterns 84 adjacent to each other in the A direction becomes (p1ss+d2).

Next, sidewall patterns 85 having the width dimension d2 and sidewall patterns 86 having ladder shapes are formed as illustrated in FIG. 52. The sidewall patterns 85 adjacent to each other in the memory cell region MA have the disposition interval d2. The sidewall patterns 86 having the ladder shapes in the dummy region DA are disposed to have the width dimension (3×d2) at the disposition interval d2 in the B direction. In this case, the sidewall patterns 86 are formed under the conditions in which the disposition interval p1ss between the dummy core material patterns 82 formed in the FIG. 50 in the A direction is equal to or smaller than d2.

Next, as illustrated in FIG. 53, the core material patterns 83 and the dummy core material patterns 84 are selectively removed by etching, and subsequently, as illustrated in FIG. 54, the core material patterns are subjected to the slimming treatment to form core material patterns 85a and dummy core material patterns 86a. The core material patterns 85a are formed to have the pattern width d3 (d3=d2/2=d1/4=0.25×d1) at the disposition interval (3×d3). The dummy core material patterns 86a are formed to have the pattern width d3 and an external form dimension (5×d3) at the disposition interval (3×d3) in the B direction.

Next, as illustrated in FIG. 55, sidewall patterns 87, 88, and 89 having the width dimension d3 are formed by deposition of the film for sidewall formation followed by etch batch. The sidewall patterns 87 are formed on both sidewalls of the core material patterns 85a to have the width dimension d3. The sidewall patterns 88 are formed on both sidewalls of the dummy core material patterns 86a to have the width dimension d3 and are formed in line shapes connected in the A direction. The sidewall patterns 89 are formed on the inner peripheral walls of the dummy core material patterns 86a to have the sidewall width dimension d3 in the rectangular shapes.

Next, as illustrated in FIG. 56, the core material patterns 85a and the dummy core material patterns 86a are selectively removed by etching leaving the sidewall patterns 87, 88, and 89 on the film to be processed. Accordingly, in the memory cell region MA, as the sidewall patterns 87, a hard mask for forming a line-and-space pattern having the width dimension d3 and the disposition interval d3 is obtained. In addition, in the dummy region DA, as the sidewall patterns 88 having the line shapes and the sidewall patterns 89 having the rectangular shapes, the dummy patterns DP6 and DP6a having the width dimension d3 and the disposition interval d3 in the B direction are obtained.

Since the dummy patterns DP6 and DP6a are disposed as described above, the same effects as those of the third embodiment may be obtained.

(Other Embodiments)

In addition to the above-described embodiments, the following modifications may be made.

The first embodiment may also be applied to a case of a line-and-space pattern formed without the use of the sidewall transfer technique. In this case, the line-and-space pattern of the dummy region DA adjacent to the memory cell region MA may be formed to have a smaller width dimension than d1 or may be disposed at a smaller disposition interval than d1, or both the width dimension and the disposition interval may be reduced in the application.

The separated patterns used as the dummy patterns described in the second embodiment may also be applied to the disposition at a small interval in the direction perpendicular to the word line WL (B direction) as in the first embodiment.

An example in which the sidewall transfer technique is used once and an example in which the sidewall transfer technique is used twice are described. However, the same dummy patterns may also be used even in a case where the sidewall transfer technique is used three or more times.

A case where the NAND type flash memory device is applied is described. However, other semiconductor devices including a configuration incorporating line-and-space patterns may also be processed according to the present disclosure. For example, in addition to gate processing described above, processing of active regions of a semiconductor substrate, processing of wiring patterns, and the like may also be applied. In addition, by performing such processing, the dummy patterns remain in the surface area of the semiconductor device.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the disclosure.

What is claimed is:

1. A semiconductor device, comprising:
a semiconductor substrate including a first region and a second region adjacent to the first region, wherein
a first line-and-space pattern extending along the semiconductor substrate in a first direction is disposed in the first region,
a dummy pattern is disposed in the second region and has a surface area per unit area that is greater than a surface area of per unit area of the first line-and-space pattern,
the dummy pattern includes a second line-and-space pattern that extends along the semiconductor substrate in the first direction,
the second line-and-space pattern having a line width in a second direction along the semiconductor substrate and perpendicular to the first direction that is equal to a line width in the second direction of the first line-and-space pattern, and
a first spacing distance in the second direction between lines of the first line-and-space pattern is greater than a second spacing distance in the second direction between lines of the second line-and-space pattern.

2. The semiconductor device according to claim 1, wherein lines of the second line-and-space pattern are comprised of a plurality of line portions, the line portions within each line of the second line-and-space pattern being spaced from each other at a distance along the first direction that is less than the first spacing distance.

3. The semiconductor device according to claim 1, wherein a memory cell transistor is disposed in the first region.

4. A semiconductor device, comprising:
a first region that is on a semiconductor substrate, the first region including a first line-and-space pattern extending along the semiconductor substrate in a first direction disposed therein; and
a second region on the semiconductor substrate, the second region being adjacent to the first region and including a second line-and-space pattern, wherein
each line in the first line-and-space pattern has a first line width along the semiconductor substrate in a second direction perpendicular to the first direction,
each space in the second direction between adjacent lines in the first line-and-space pattern is equal to a first spacing distance,
each line in the second line-and-space pattern has the first line width along the semiconductor substrate in the second direction,
each space in the second direction between adjacent lines in the second line-and-space pattern is equal to a second spacing distance, and
the first spacing distance is greater than the second spacing distance.

5. The semiconductor device of claim 4, wherein the first region includes a memory cell transistor and the second region is a dummy pattern region.

6. The semiconductor device of claim 4, wherein the lines of the first line-and-space pattern are word lines of a memory cell transistor array.

* * * * *